United States Patent [19]
Kamikawa et al.

[11] Patent Number: 5,940,985
[45] Date of Patent: Aug. 24, 1999

[54] APPARATUS AND METHOD FOR DRYING SUBSTRATES

[75] Inventors: Yuji Kamikawa, Koshimachi; Kinya Ueno, Nirasaki, both of Japan

[73] Assignee: Tokyo Electron Limited, Tokyo, Japan

[21] Appl. No.: 08/808,858

[22] Filed: Feb. 28, 1997

[30] Foreign Application Priority Data

Mar. 1, 1996 [JP] Japan .................................. 8-071383
Jul. 5, 1996 [JP] Japan .................................. 8-195460

[51] Int. Cl.$^6$ .......................................................... F26B 3/00
[52] U.S. Cl. .............................................. 34/471; 34/78
[58] Field of Search .................................. 34/77, 78, 74, 34/73, 467, 468, 469, 470, 443

[56] References Cited

U.S. PATENT DOCUMENTS 5,369,891 12/1994 Kamikawa .................................. 34/78
5,371,950 12/1994 Schumacher .............................. 34/78
5,443,540 8/1995 Kamikawa .............................. 34/471

FOREIGN PATENT DOCUMENTS 2544971 7/1996 Japan .

Primary Examiner—Henry A. Bennett
Assistant Examiner—Pamela A. Wilson
Attorney, Agent, or Firm—Oblon, Spivak, McClelland, Maier & Neustadt, P.C.

[57] ABSTRACT

A substrate drying device including a process chamber, a transferring device for transferring a substrate to/from the process chamber, a solvent vapor generating chamber having a container for receiving liquid organic solvent and a heater for heating the liquid organic solvent of the container to generate vapor of the organic solvent, a solvent supply unit for supplying the liquid organic solvent in the container, a first passage, communicating with the solvent vapor generating chamber and the process chamber, for passing vapor of the organic solvent, a second passage, communicating with the container of the solvent vapor generating chamber and the solvent supply unit, for passing liquid organic solvent, a flow rate controller for controlling flow rate of the liquid organic solvent to be supplied to the solvent vapor generating chamber from the solvent supply unit, and a control device for detecting a state of organic solvent of at least one of the solvent supply unit, the solvent vapor generating chamber, and the process chamber to control an operation of the flow rate controller based on the detected state of organic solvent.

27 Claims, 14 Drawing Sheets

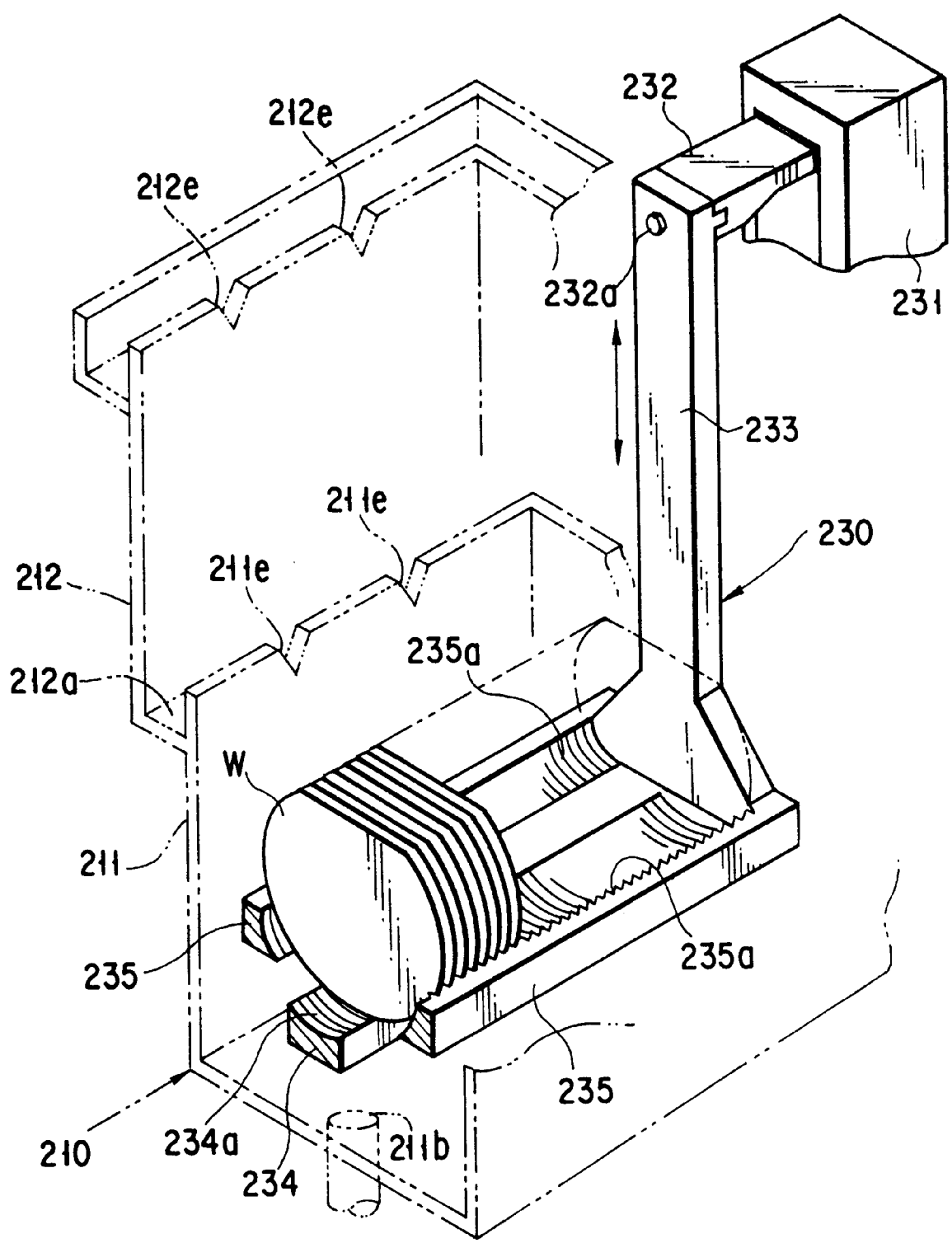
F I G. 12

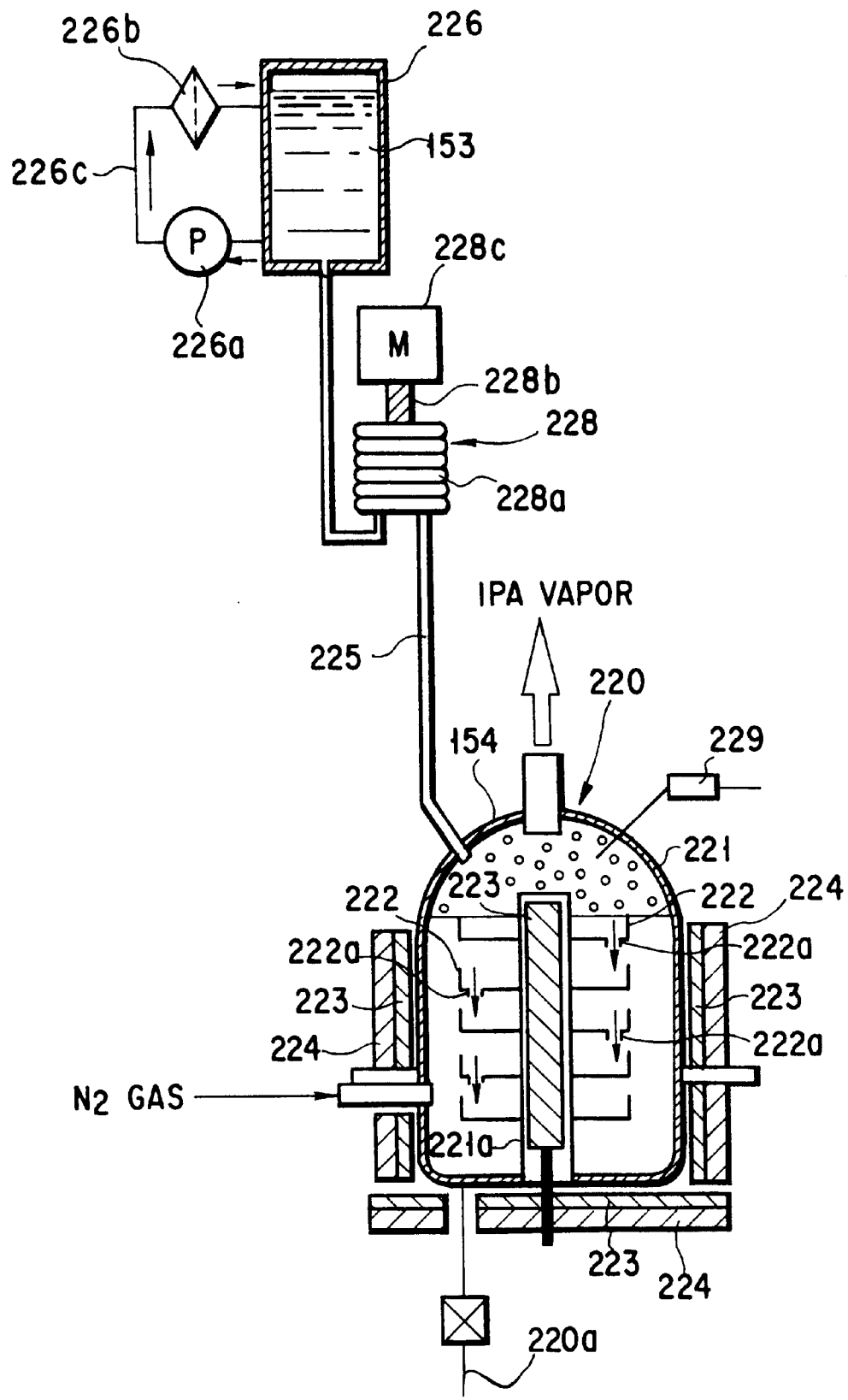
F I G. 13

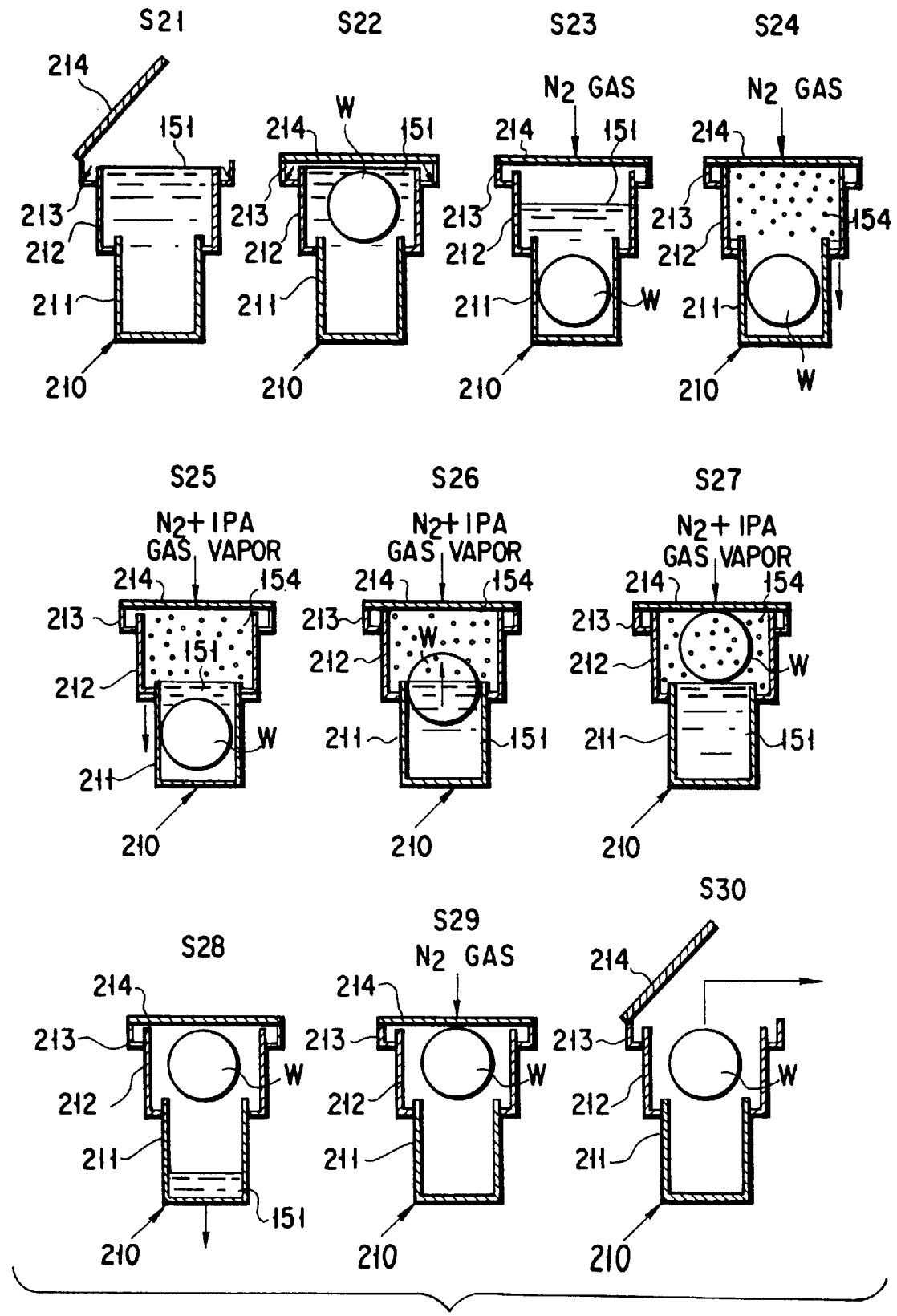
F I G. 14

APPARATUS AND METHOD FOR DRYING SUBSTRATES

BACKGROUND OF THE INVENTION

The present invention relates to an apparatus for drying semiconductor wafers or LCD glass substrates by use of vapor of organic solvent such as an alcohol group, and a method for drying substrates by use of organic solvent vapor.

In the manufacture of a semiconductor device, there is used a wet-type washing/drying system for removing contamination such as particles or organic material from a wafer surface. The wet-type washing/drying system comprises a plurality of washing process tanks and drying process tanks to perform a continuous batch process. Chemicals or pure water is supplied to each washing process tank, and a plurality of wafers are dipped in liquid at one time to be cleaned. On the other hand, vapor of organic solvent such as isopropyl alcohol $((CH_3)_2CHOH$, hereinafter called "IPA") is supplied to the drying process tank, so that the plurality of wafers are dried at one time by a function of organic solvent vapor.

In a closed-type washing/drying device, IPA vapor is supplied to the process tank as discharging washing liquid (pure water) from a lower portion of the tank. As a result, the wafers can be dried just after washing. According to this type, since a film of washing liquid (pure water) is removed from the surface of each wafer, a clean dried surface can be obtained without generating a water mark on the wafer surface. In this type of the device, IPA liquid is supplied to a vapor generating chamber from an IPA liquid supply unit to heat IPA liquid and to generate vapor. Then, IPA vapor is introduced to the process tank from the vapor generating chamber.

In this type of the device, since IPA liquid of the vapor generating chamber is consumed, it is necessary to supply IPA liquid to the vapor generating chamber from the IPA liquid supply unit. However, if an inner pressure of the vapor generating chamber is gradually increased by generation of IPA vapor, it is difficult to supply IPA liquid to the vapor generating chamber from the IPA liquid supply unit.

Japanese Patent registration No. 2544971 discloses a washing/drying device in which a fixed amount of organic solvent is dropped on a hot plate of a preliminary chamber to generate a fixed amount of organic solvent vapor, and the fixed amount of solvent vapor is supplied to a main chamber to dry a glass substrate. However, in this device, since the fixed amount of solvent is supplied to the vapor generating chamber for a long period of time during the process, vapor is excessively supplied to the process tank from the vapor generating chamber, and the total amount of consumption of solvent is excessively increased.

BRIEF SUMMARY OF THE INVENTION

An object of the present invention is to provide a substrate drying device in which organic solvent for vapor used in drying can be smoothly supplied to a vapor generating chamber, and an amount of consumption of organic solvent can be reduced, and to provide its drying method.

As a result of studying the drying phenomenon of substrates due to organic solvent vapor, the inventors of this invention found out that the following three points were important as elements exerting influence on drying efficiency:

(1) amount of solvent vapor
(2) concentration of solvent vapor
(3) contact area between solvent vapor and a substrate.

In order to control the above items (1) and (2), an amount of heating solvent due to a heater can be considered. However, in a conventional process, a vapor speed of solvent can be controlled by adjusting the amount of heating solvent due to the heater. However, the amount of generation of solvent vapor cannot be changed for a short period of time, e.g., 2 to 3 seconds. In the prior art, since response speed is low, the amount of generation of solvent vapor or concentration cannot be correctly controlled, accuracy of the drying process is low, and the amount of consumption of organic solvent is excessively increased.

According to the present invention, there is provided a
  substrate drying device comprising a process chamber;
  transferring means for transferring a substrate to/from the process chamber;
  a solvent vapor generating chamber having a case for receiving liquid organic solvent and a heater for heating the liquid organic solvent of the case to generate vapor of the organic solvent; a solvent supply unit for supplying the liquid organic solvent of the case;
  a first passage, communicating with the solvent vapor generating chamber and the process chamber, for passing vapor of the organic solvent;
  a second passage, communicating with the case of the solvent vapor generating chamber and the solvent supply unit, for passing liquid organic solvent;
  a flow rate controller for controlling a flow rate of the liquid organic solvent to be supplied to the solvent vapor generating chamber from the solvent supply unit; and
  control means for detecting a state of organic solvent of at least one of the solvent supply unit, the solvent vapor generating chamber, and the process chamber to control an operation of the flow rate controller based on the detected state of organic solvent.

Also, according to the present invention, there is provided a substrate drying method of heating liquid organic solvent supplied to a solvent vapor generating chamber from an organic solvent supply unit to generate vapor of organic solvent, and introducing the organic solvent vapor to a process chamber to dry a substrate of the process chamber, wherein no liquid organic solvent is supplied to the solvent vapor generating chamber from the organic solvent supply unit when vapor of organic solvent is introduced to the process chamber from the solvent vapor generating chamber, and generation of organic solvent vapor of the solvent vapor generating chamber is restrained when liquid organic solvent is supplied to the solvent vapor generating chamber from the organic solvent supply unit.

According to the present invention, when organic solvent is heated to generate vapor, the inner pressure of the vapor generating chamber is increased, and no organic solvent is supplied to the vapor generating chamber. On the other hand, when the organic solvent is supplied to the vapor generating chamber, the generation of organic solvent vapor is restrained, so as to reduce the inner pressure of the vapor generating chamber. In order to restrain the generation of organic solved vapor, the heating of organic solvent may be stopped. Or, vapor of the vapor generation chamber may be let free to a trap passage having a cooling function. After the pressure of the vapor generating chamber is reduced, organic solvent is introduced to the vapor generating chamber from the supply unit. Thus, since organic solvent is supplied in only the state that pressure of the vapor generating chamber is low, organic solvent can be smoothly supplied from the supply unit.

Also, the inner pressure of the solvent supply unit is increased, so that organic solvent can be compressed to be sent to the vapor generating chamber from the solvent supply unit.

Moreover, when vapor of organic solvent is introduced to the process tank, organic solvent vapor may be introduced to the process tank by vapor pressure. Or, vapor may be introduced to the process tank by carrier gas.

Further, when a liquid level of organic solvent of the vapor generating chamber is detected and the detected liquid level is less than a threshold value, organic solvent is desirably supplied to the vapor generating chamber from the organic solvent supply unit. Also, when the temperature of vapor of organic solvent is detected and the detected temperature is more than a threshold value, organic solvent is desirably supplied to the vapor generating chamber from the organic solvent supply unit.

According to the present invention, there is provided a substrate drying method of heating liquid organic solvent supplied to a solvent vapor generating chamber from an organic solvent supply unit to generate vapor of organic solvent, introducing the organic solvent vapor to a process chamber to dry a substrate of the process chamber, and comprising the steps of:

detecting a process state of the substrate; and controlling an amount of a supply of liquid organic solvent to the solvent vapor generating chamber in accordance with the detected process state of the substrate so as to change the concentration of the vapor of organic solvent to be supplied to the process chamber from the solvent vapor generating chamber.

Furthermore, according to the present invention, there is provided a substrate drying method of relatively moving a substrate and a washing tank after dipping the substrate in washing liquid to be cleaned, bringing the vapor of the organic solvent generated in a solvent vapor generating chamber into contact with the substrate to be dried, and comprising the steps of:

detecting a surface area of the substrate exposed to an upper portion of a liquid level of washing liquid during the movement of the substrate and washing tank; and controlling an amount of a supply of liquid solvent to the solvent vapor generating chamber based on the detected surface area of the substrate to change concentration of the vapor of the organic solvent to be brought into contact with the substrate exposed to the upper portion of the liquid level.

In the vapor generating chamber in which an organic solvent is vaporized, there is a tendency that an impurity material contained in organic solvent gradually stays. To avoid such a problem, it is desirable that the impurity material of the organic solvent be removed by filtering organic solvent of the vapor generating chamber. In this case, there may be formed a circuit for circulating the organic solvent of the vapor generating chamber to capture the impurity material of the organic solvent by the filter in the middle of the circulation circuit to remove the impurity material.

Also, vapor of the organic solvent may be heated to prevent the vapor of the organic solvent from being condensed in the middle of introduction to the process tank. In this case, the vapor of the organic solvent generated in the vapor generating chamber can be efficiently supplied to the process tank.

In the case of supplying organic solvent to the solvent supply unit or the case of exchanging the solvent supply unit, it is needed that the solvent supply unit be opened to atmospheric pressure. In this case, if the solvent supply unit is opened to atmospheric pressure in a state that the inner pressure of the vapor generating chamber is high, there is possibility that vapor of the vapor generating chamber flows backward to the solvent supply unit side, vapor of organic solvent is jetted to the outer unit to cause a fire hazard. To avoid such a hazard, the interior of the vapor generating chamber is desirably set to be atmospheric pressure in advance before the circuit connecting the solvent supply unit to the vapor generating chamber is opened to atmosphere.

Moreover, an atmosphere around the solvent vapor generating chamber may be set to non-oxidizing gas. Also, an atmosphere around the process chamber is set to non-acid gas. As a result, an explosion protection for the vapor generating chamber and the process chamber can be obtained, and a safety measure can be ensured.

As organic solvent for drying process, there may be used isopropanol, methanol, 1-propanol, tert-butanol, or mixture of these materials other than isopropyl alcohol.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a perspective view showing a wafer board in the process tank;

FIG. 13 is a cross-sectional view showing an IPA vapor generating chamber, a solvent supply unit, and a solvent flow rate controlling mechanism;

FIG. 14 is a flow chart of the wafer washing/drying process;

DETAILED DESCRIPTION OF THE INVENTION

Embodiments of the present invention will now be described with reference to the accompanying drawings.

Figure 1:
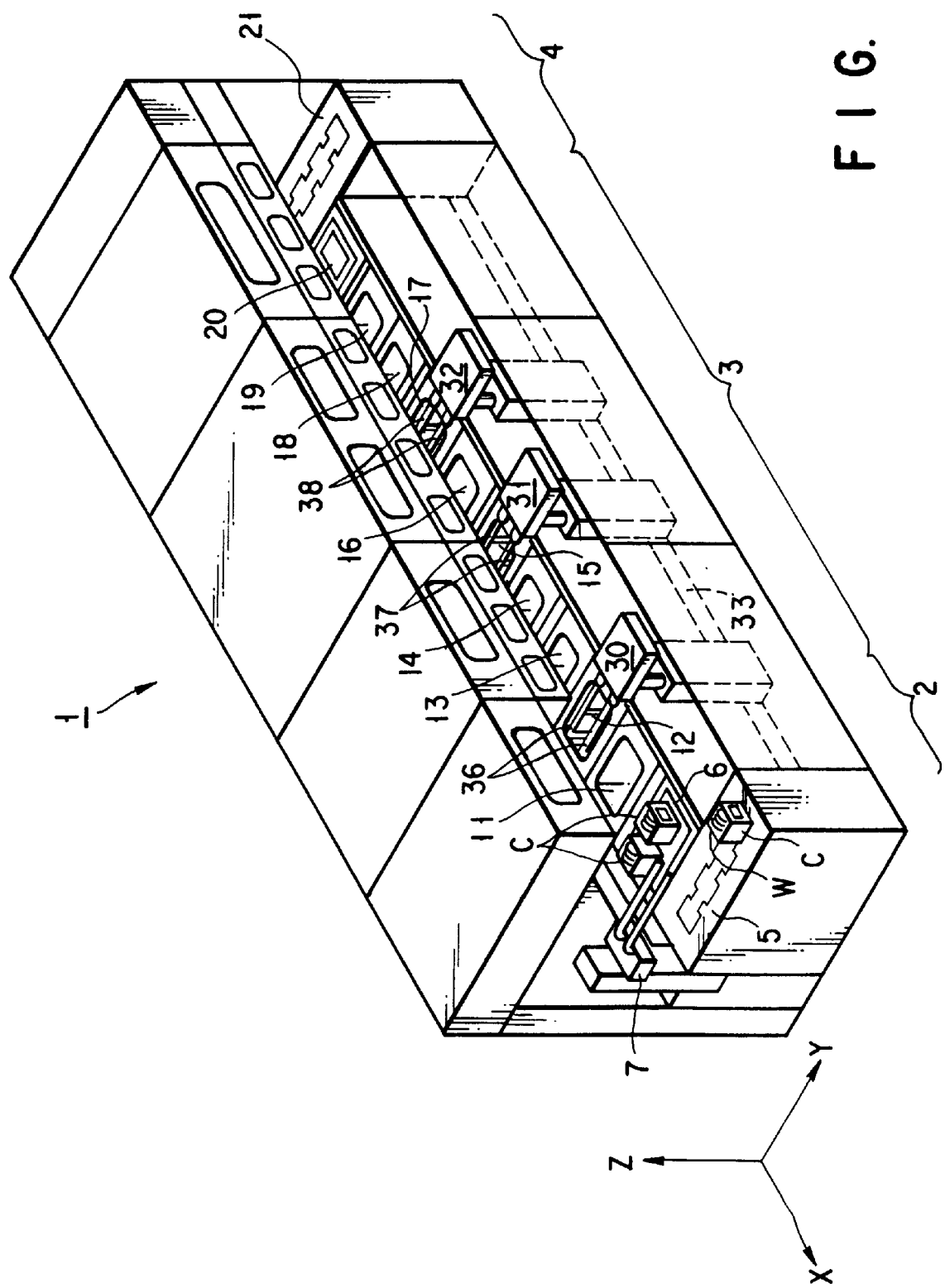
FIG. 1 is a schematic perspective view showing a wafer washing/drying device.
Figure 2:
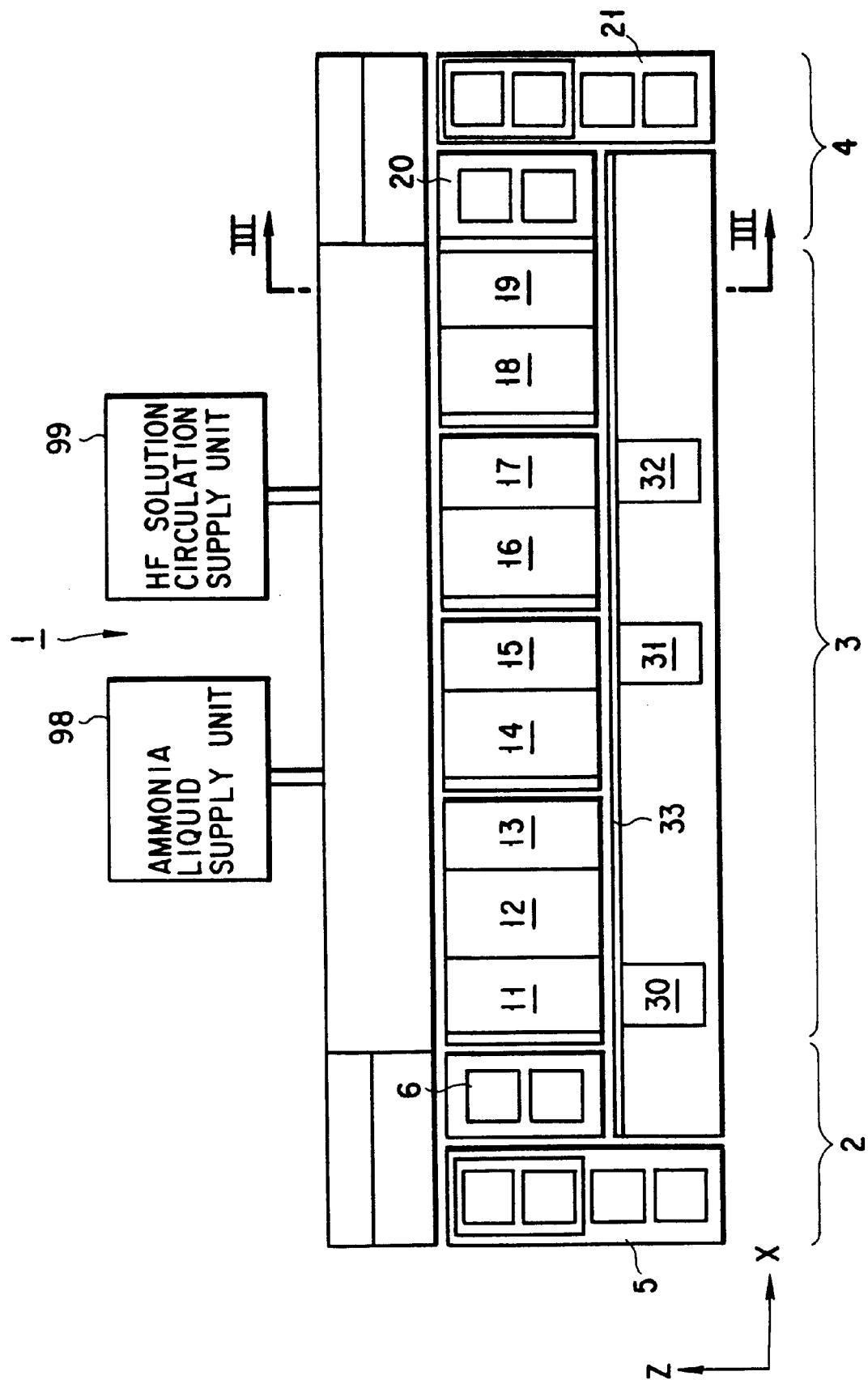
FIG. 2 is a schematic plane view of the wafer washing/drying device.
Figure 3:
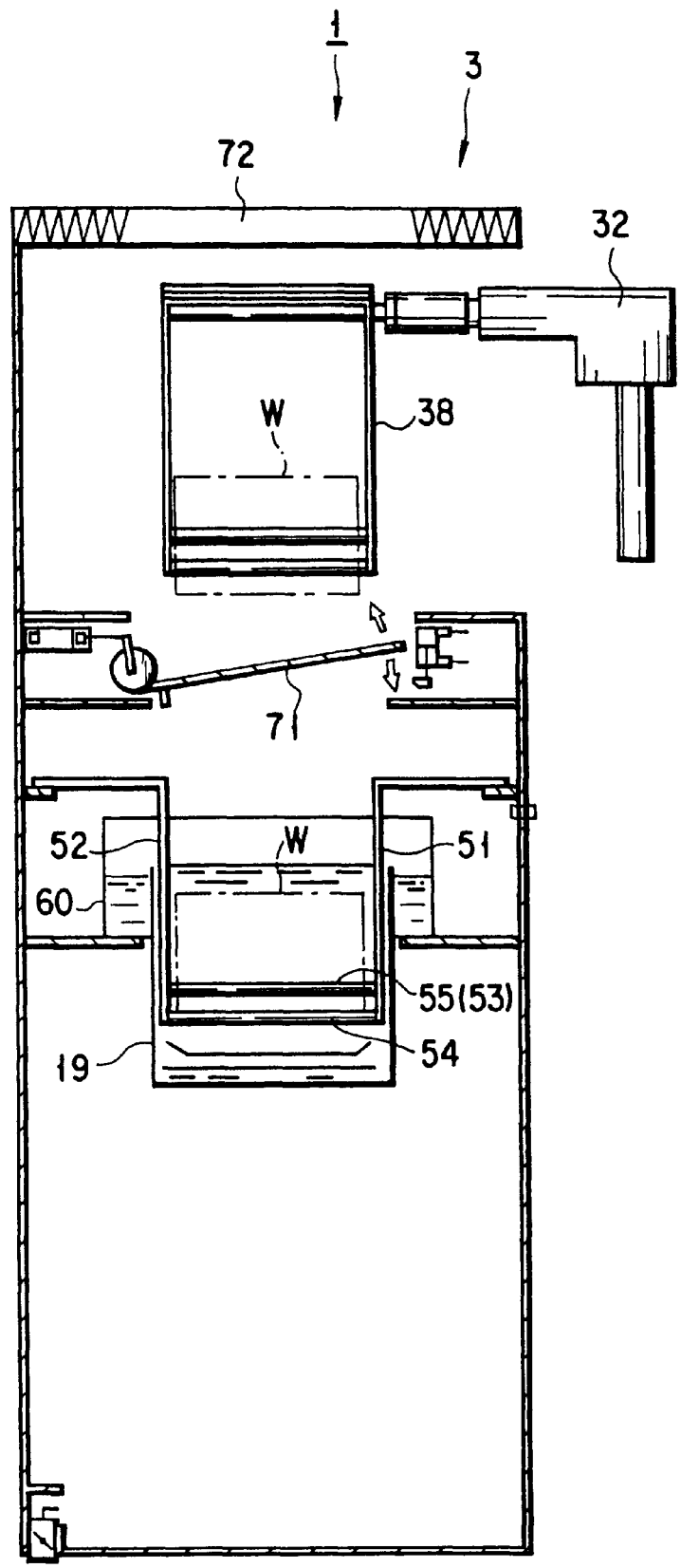
FIG. 3 is a cross-sectional view showing the device cut along line of III—III of FIG. 2.

As shown in FIGS. 1 and 2, a washing/drying system 1 comprises a loader section 2, a process section 3, and unloader section 4. The loader section 2 has a cassette station 5 and a transfer device 7. The cassette station 5 is formed such that a plurality of cassettes C is transferred from a deliver device (not shown) to be mounted on the cassette station 5. Each cassette C has 25 pre-washing wafers W. The transfer device 7 transfers two cassettes to a stage at one time.

The process section 3 comprises three transfer devices 30, 31, 32, and a plurality of process chambers 11 to 19. The transfer devices 30, 31, 32 are formed to be movable in X-, Y-, and Z-axial directions, respectively. The first transfer device 30 has a wafer chuck 36, and 50 wafers W are taken out of two cassettes C on the stage 6 at one time by the wafer chuck 36, and transferred to the respective process tanks. The second transfer device 31 has a wafer chuck 37, and 50 wafers W are taken up at one time by the wafer chuck 37, and transferred to a next process chamber. Also, the third transfer device 32 has a wafer chuck 38, and 50 wafers W are taken up at one time by the wafer chuck 38, and transferred to a next process chamber.

The unloader section 4 has a stage 20 and a cassette station 21. The stage 20 has the same cassette transfer device 7 as mentioned above. The plurality of cassettes C are mounted on the cassette station 21, and washed and dried wafers W are contained in these cassettes C. Moreover, cassettes C are delivered from the cassette station 21 by a delivering device (not shown).

The first process chamber 11 of the process section 3 washes and dries the first chuck 36. The process chambers 12 and 15 wash wafers W with chemicals. The process chambers 13, 14, 16 and 17 rinse chemical-washed wafers W with pure water. The process chamber 18 washes and dries the third wafer chuck 38. Finally, the process chamber 19 dries wafers W.

Then, mixing chemicals ($NH_4OH+H_2O_2+H_2O$) of ammonia solution and hydrogen peroxide solution is circulated to be supplied to the second process chamber 12. Liquid ammonia is supplied to such a circulation circuit from a liquid ammonia supply unit 98. In the second process chamber 12, there is carried out the so-called SC1 cleaning in which organic material or particles adhered onto the surface of the wafer is removed. On the other hand, mixing chemicals ($HCl+H_2O_2$) of hydrochloric acid solution and hydrogen peroxide solution are circulated to be supplied to the fifth process chamber 15. In the fifth process chamber 15, there is carried out the so-called SC2 cleaning in which metallic ions adhered onto the surface of the wafer are removed. Then, dilute hydrofluoric acid solution ($HF+H_2O$) is circulated to be supplied to the final process chamber 19. Also, pure water is supplied thereto, and IPA vapor is further supplied thereto. As chemicals for washing, it is possible to use mixing chemicals ($H_2SO_4+H_2O_2$) of sulfuric acid solution and hydrogen peroxide solution.

Figure 4:
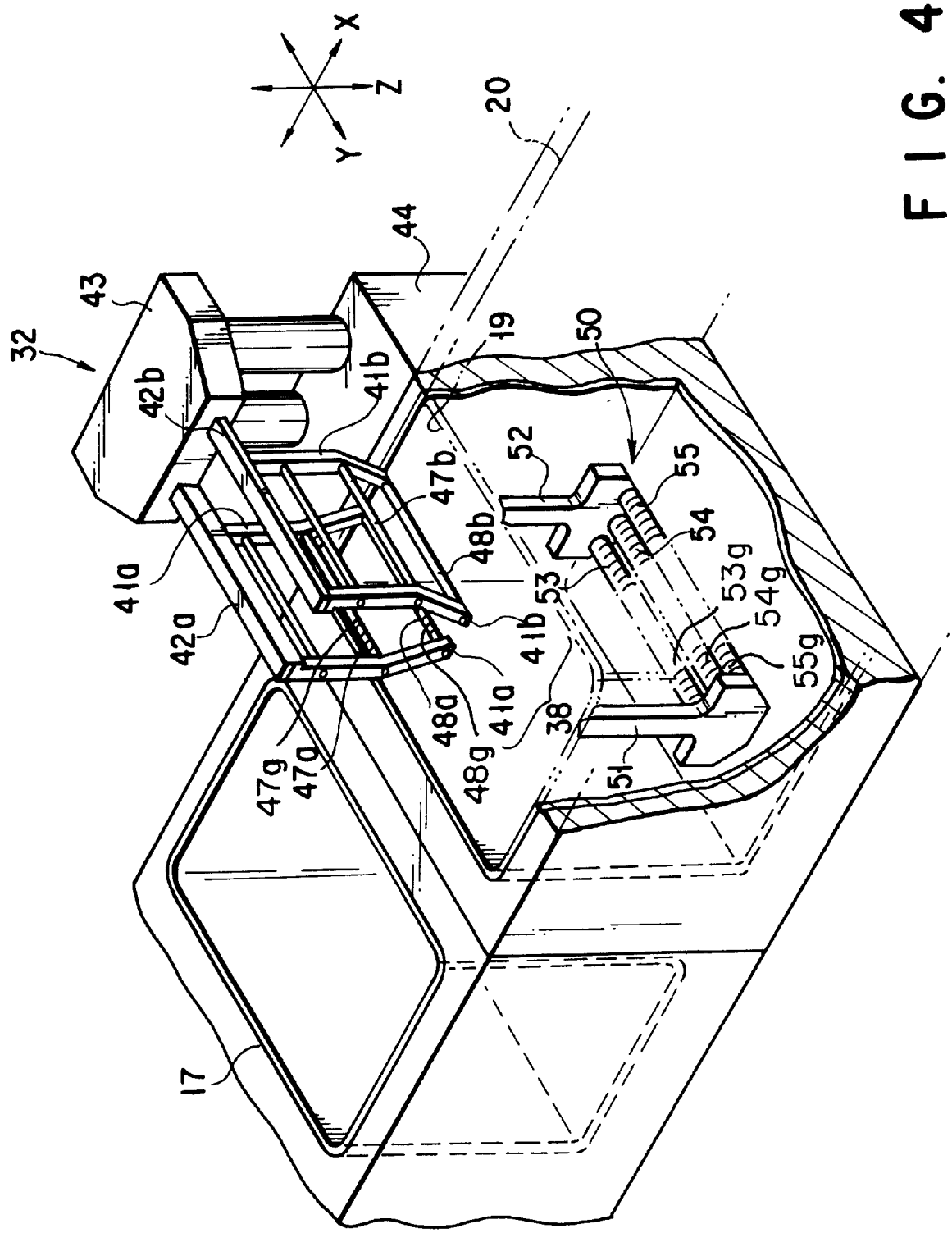
FIG. 4 is a schematic perspective view showing a wafer transferring device.

The following will explain a case in which wafers W are transferred to/from the process chamber 19 by the transfer device 32 with reference to FIG. 4.

The wafer chuck 38 of the transfer device 32 has a pair of holding members 41a and 41b for holding 50 wafers at one time. Each of the holding members 41a and 41b is supported by a support section 43 through horizontal arms 42a and 42b. Each of the horizontal arms 42a and 42b is axially rotated by a θ rotation mechanism built in the support section 43. The support section 43 is supported by a Z-axis drive mechanism 44 to be movable up and down. The Z-axis drive mechanism 44 itself is formed to be slidable in an X-axial direction along the process section 3. The entire wafer chuck 38 is formed to be movable in a Y-axial direction by a Y-axial drive mechanism (not shown) build in the support section 43. Moreover, the support section 43 itself can slightly control its direction in a horizontal plane by a direction control mechanism (not shown).

Upper end portions of the holding members 41a and 42b are fixed to the horizontal arms 42a and 42b, respectively. Moreover, two pairs of holding rods 47a, 47b, 48a, and 48b of quartz are formed between the lower end portion between the holding members 41a and 41b to be parallel to each other. These rods have 50 grooves 47g and 48g for holding wafers, respectively.

In each of the process chambers, a board 50 of quartz is formed. Then, horizontal support rods 53, 54, and 55 of the board 50 have 50 grooves 53g, 54g, and 55g, respectively. The pitch distance of each of these grooves 53g, 54g and 55g and that of each of these grooves 47g and 48g are substantially the same the pitch distance of the cassette C.

The following will explain the final process chamber 19 with reference to FIGS. 3 to 8.

In the final process chamber 19, the wafers W are dried just after the wafers W are washed. The process chamber 19 is box-shaped, and its upper portion is opened, and an outer vessel 60 is provided around the upper portion of the process chamber 19. An open/close cover 71 is formed above the process chamber 19 to cover the opening of the upper portion of the process chamber 19. An air conditioner such as a fan filter unit having a filter 72 or a fan unit is provided at further upper portion of the cover 71 such that downflow of purged air is directed to the process chamber 19.

Figure 5:
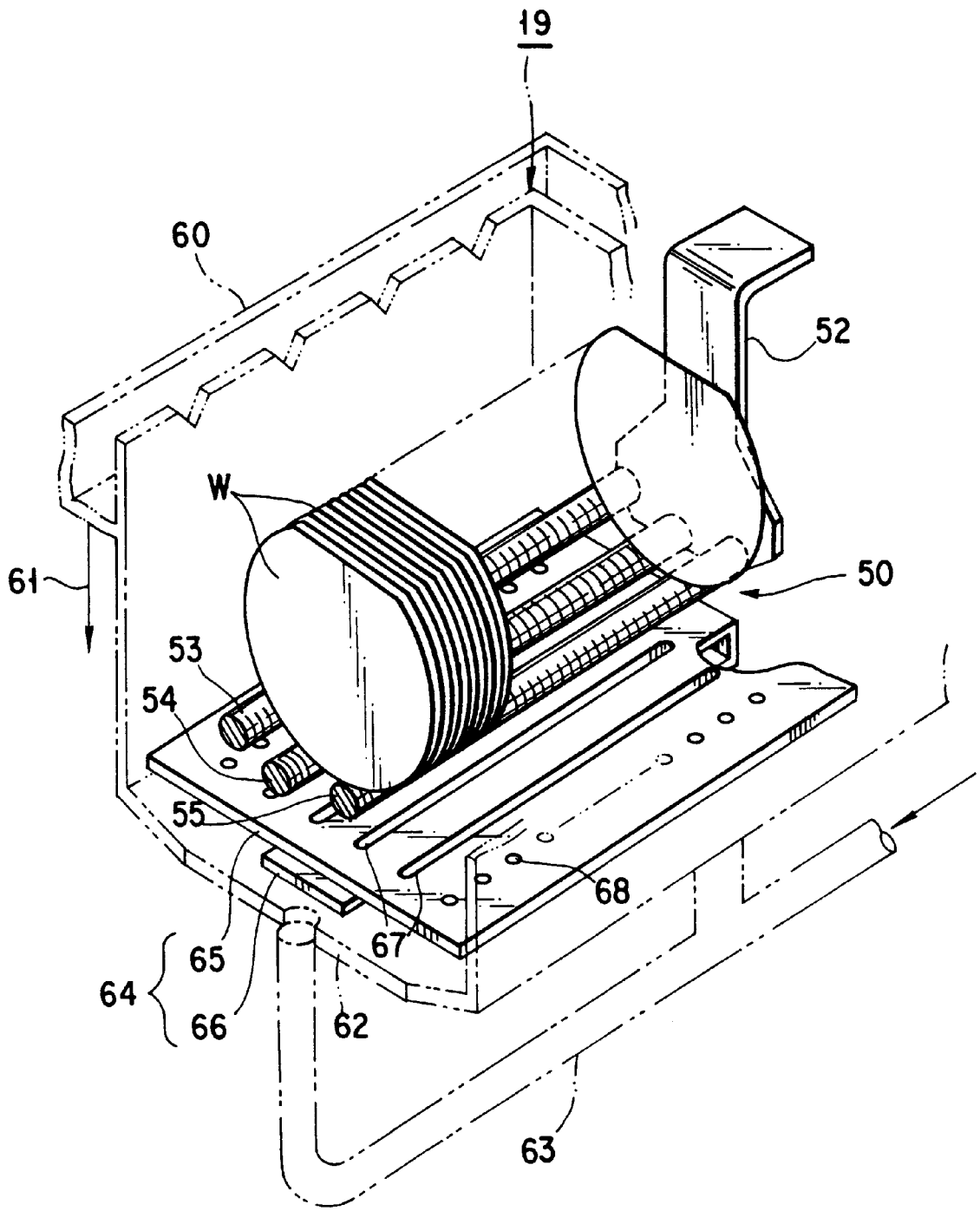
FIG. 5 is a perspective view showing an interior of a process tank partially cut.

As shown in FIG. 5, the outer vessel 60 receives liquid overflowed from the process chamber 19, and allows the received liquid to flow to a cleaning liquid circulation mechanism 75 to be described later through a circuit 61. At the bottom portion of the process chamber 19, there is formed rectifying means 64. The rectifying means 64 comprises a rectifying board 65 and a diffusion plate 66. The rectifying board 65 is formed between a process chamber bottom portion 62 and a wafer board 50 to be substantially horizontally. The diffusion plate 66 is formed at the lower portion of the rectifying plate 65. The rectifying plate 65 has a plurality of slits 67 and a plurality of small holes 68. The small holes 68 are arranged at both sides of the slits 67.

If washing liquid is introduced into the process chamber 19 through a circuit 63, washing liquid collides with the diffusion plate 66 to be diffused to the entire rear surface of the rectifying board 65. Then, washing liquid passes through the slits 67 and the small holes 68 to move up the portions between the wafers W and the surroundings around the wafers W. The wafers W are enveloped with such washing liquid having a uniform flow rate and no turbulence. As a result, the entire surface of each wafer W is uniformly cleaned.

Figure 6:
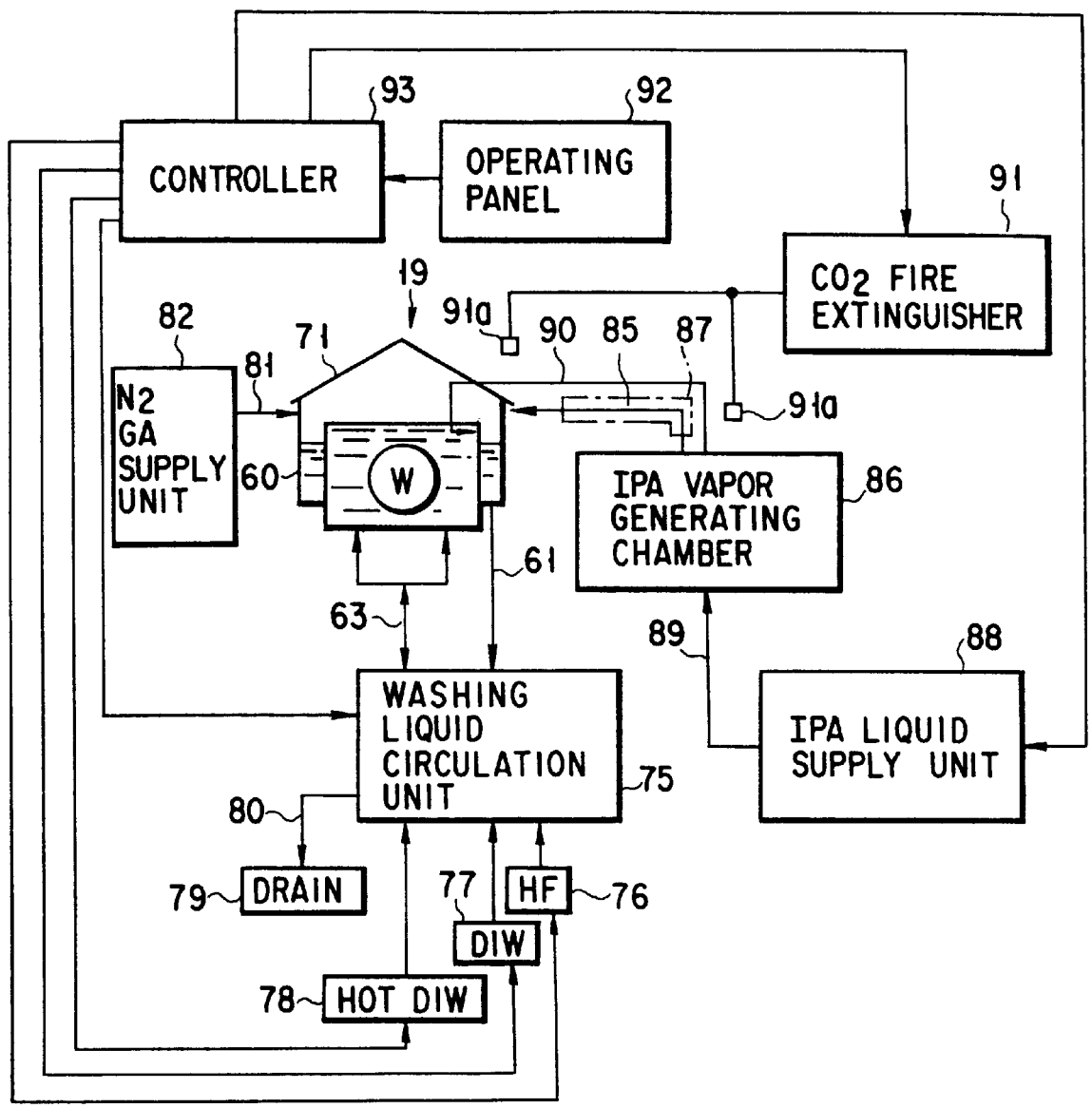
FIG. 6 is a block diagram showing a washing/drying device for a substrate according to an embodiment of the present invention.

As shown in FIG. 6, an overflow circuit 61 communicates with the washing liquid circulation mechanism 75. The washing liquid circulation mechanism 75 communicates with the bottom portion of 62 of the process chamber 19 through the circuit 63. Thus, the washing liquid circulation mechanism 75 and the process chamber 19 forms one circulation circuit through the circuits 61 and 63. In this case, three liquid supply units 76, 77, and 78 are communicated with the washing liquid circulation mechanism 75, and liquid is supplied to the washing liquid circulation mechanism 75 from each supply unit. In the supply unit 76, dilute hydrofluoric acid water solution (HF) is contained. In the supply unit 77, pure water (DIW) of about room temperature is contained. In the supply units 78, hot pure water (HOT DIW) whose temperature is controlled to be more than room temperature and less than 80° C. is contained. The washing liquid circulation mechanism 75 communicates with a drain section 79 through a circuit 80. In this case, the washing liquid circulation mechanism 75 has a pump, a dumper, a filter, a change-over valve, etc within.

The power switches of the washing liquid circulation mechanism 75, and the liquid supply units 76, 77, and 78 are connected to the output side of a controller 93 so as to control the change-over operation of the liquid circulation and the liquid exhaust and the supply operation of each liquid. The controller 93 has a control panel 92. The entire process of the process chamber 19 is controlled by the controller 93 in accordance with the input of the panel 92.

By an operation control command of the controller 93, chemical solution is supplied from the liquid supply unit 76, and overflowed liquid from the process chamber 19 is returned to the process chamber 19 through the circuit 63, or exhausted to the drain section 79 through the circuit 80. Moreover, pure water (DIW) of about room temperature is supplied to the process chamber 19 from the supply unit 77 through the washing liquid circulation mechanism 75. Also, hot pure water (HOT DIW) whose temperature is controlled is supplied to the process chamber 19 from the supply unit 78 through the washing liquid circulation mechanism 75.

Next, the following will explain a case in which the wafers W are washed.

First of all, a predetermined flow of dilute hydrofluoric acid solution (HF) is supplied to the washing liquid circulation mechanism 75 from the supply unit 76. Then, supplied liquid is continuously supplied to the bottom of the process chamber from the washing liquid circulation mechanism 75 through the circuit 63, so that an ascending current of dilute hydrofluoric acid solution is formed in the process chamber 19. Liquid overflowed from the process chamber 19 flows to the outer vessel 60 to be introduced to the washing liquid circulation mechanism 75 through the overflow circuit 61. The washing liquid circulation mechanism 75 filters overflowed liquid so as to be purged. Also, the washing liquid circulation mechanism 75 adjusts the temperature and concentration of liquid. Thereafter, liquid is returned to the process chamber 19. In this case, the adjustment of liquid concentration is carried out based on a detection value of liquid concentration of the process chamber 19. The liquid concentration of the process chamber 19 is detected by a concentration sensor (not shown). Thus, when HF is ended, the wafers W are rinsed with pure water (DIW).

In the rinse process, pure water (DIW) of about room temperature is started to be supplied to the washing liquid circulation mechanism 75 from the supply unit 77 in a state that dilute hydrofluoric acid solution (HF) is contained in the process chamber 19. Pure water is introduced to the process chamber 19 from the washing liquid circulation mechanism 75 so as to discharge dilute hydrofluoric acid solution from the process chamber 19. Liquid overflowed from the process chamber 19 is exhausted to the drain section 79 via the outer vessel 60, the circuit 61, the washing liquid circulation mechanism 75, and the circuit 80. Thus, pure water is supplied to the process chamber 19 from the supply unit 77 and the overflowed liquid is exhausted to the drain section 79, thereby substituting liquid of the process chamber 19 with pure water. In this case, by a resistivity device (not shown), resistivity of liquid of the process chamber 19 is measured. Then, the controller 93 checks whether or not liquid of the process chamber 19 is substituted with pure water based on the measuring result.

Next, hot pure water (HOT DIW) whose temperature is controlled is started to be supplied from the supply unit 78 to the washing liquid circulation mechanism 75. Then, pure water (DIW) of the process chamber 19 is driven out by hot pure water (HOT DIW), so that pure water (DIW) is substituted with hot water (HOT DIW). The wafers W are heated to about more than the room temperature and less than 80° C. by HOT DIW. In this case, by a temperature indicator (not shown), resistivity of liquid of the circuit 61 is measured. Then, the controller 93 checks whether or not liquid of the process chamber 19 is substituted with hot pure water (HOT DIW) based on the measuring result. Moreover, the washing liquid circulation mechanism 75 discharges hot pure water (HOT DIW) of the process chamber 19 to the drain section 79.

As shown in FIG. 6, a circuit 85 is communicated with the process chamber 19 through a side wall of the outer vessel 60. IPA vapor is introduced to the process chamber 19 from an IPA vapor generating chamber 86 through the circuit 85. A tape heater 87 is provided around the circuit 85. The circuit 85 is heated to about 80° C. by the tape heater 87 so as to prevent IPA vapor from being condensed in the circuit 85. In this case, IPA liquid is supplied to the IPA vapor generating chamber 86 from an IPA liquid supply unit 88 through a circuit 89.

A circuit 90 for introducing IPA liquid communicates with the upper portion of the process chamber 19. One end side of the circuit 90 is opened at the bottom portion of the IPA vapor generating chamber 86, and the other end comes in contact with an inner wall of the process chamber 19 so as to be closed. Thus, IPA liquid is taken out of the IPA vapor generating chamber 86 through the one end side of the circuit 90, and supplied to the process chamber 19 as the other end of the circuit 90 comes in contact with the inner wall of the process chamber 19.

A plurality of fire extinguishing nozzles 91a is formed around the process chamber 19 and the IPA vapor generating chamber 86. Each of the nozzles 91a communicates with a $CO_2$ fire extinguisher 91, and $CO_2$ gas is jetted from each nozzle 91a.

Figure 7:
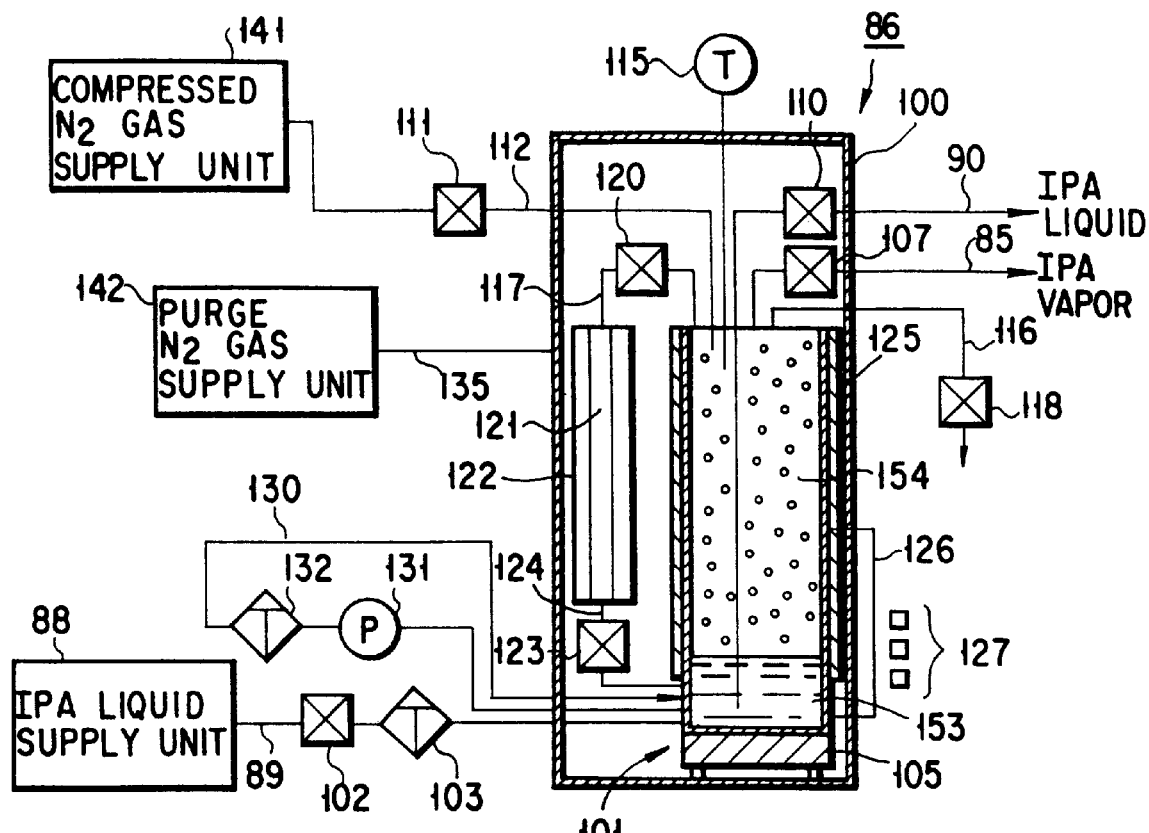
FIG. 7 is a block diagram showing the outline of an IPA vapor generating chamber.

Next, the following will explain the IPA vapor generating chamber 86 with reference to FIG. 7.

The IPA vapor generating chamber 86 is surrounded with an airtight casing 100. The casing 100 has a container 101 with which one of each of the circuits 85, 89, and 90 communicates. The other end of the circuit 89 communicates with the IPA liquid supply unit 88 through a valve 102, and a filter 103. A heater 105 is formed at the bottom portion of the container 101. A power unit of the heater 105 is connected to the controller 93. Then, IPA liquid 153 contained in the container 101 is heated to temperature, which is more than a boiling point (about 80° C.), e.g., about 120°

C. If IPA liquid 153 is heated, IPA vapor 154 is generated in the container 101, inner pressure of the container 101 becomes higher than atmospheric pressure.

The circuit 85 is formed from the upper portion of the container 101 to the side portion of the outer vessel 60. A valve 107 is attached to the circuit 85. If the value 107 is opened in a state that the inner pressure of the container 101 becomes higher than atmospheric pressure, IPA vapor 154 is supplied to the process chamber 19 from the container 101 by a pressure difference between the inner pressure and atmospheric pressure.

The circuit 90 is formed from the lower portion of the container 101 to the upper portion of the inner wall of the process chamber 19. One end of the circuit 90 is dipped in IPA liquid of the container 101. An open/close valve 110 is attached to the circuit 90 to adjust the supply of IPA liquid to the process chamber 19.

A compressed $N_2$ gas supply unit 141 communicates the container 101 through a circuit 112 to supply compressed $N_2$ gas to the container 101. The circuit 112 has a valve 111. If the valve 111 of the circuit 112 is opened in a state that the valve 110 of the circuit 90, compressed $N_2$ gas is introduced to the main body of the vapor generating chamber 86. As a result, IPA liquid 153 of the bottom portion of the case pushed to the circuit 90 to be introduced to the process chamber 19 through the circuit 90. In this case, the circuit 90 is opened in a state that the circuit 90 contacts the inner wall of the process chamber 19. Due to this, IPA liquid can be introduced to the process chamber 19 as being transmitted to the inner wall of the process chamber 19. The supply of IPA liquid to the process chamber 19 may be carried out by use of the difference pressure between the inner pressure of the IPA vapor generating chamber 86 and that of the process chamber 19.

A temperature sensor 115 is provided on the upper surface of the container 101, and circuits 116 and 117 are connected thereto. As temperature sensor 115, a thermocouple can be used. The temperature sensor 115 measures temperature of the IPA vapor 154 filled in the upper portion of the container 101, and inputs a temperature measuring signal to the controller 93. One end of the circuit 116 communicates with the inner portion of the container 101, and the other end is opened to atmosphere through a valve 118.

The circuit 117 is connected to the upper end of a trap passage 121 through a valve 120. A wafer jacket 122 for cooling is formed around the trap passage 121. If the valve 120 is opened, IPA vapor 154 of the container 101 flows to the trap passage 121 from the circuit 117. Then, IPA vapor is cooled by the water jacket 122 so as to be condensed. The lower end of the trap passage 121 communicates with the lower section of the container 101 through a circuit 124 having a valve 123. IPA vapor 154 of the upper portion of the container 101 is liquidized by the wafer jacket 122 so as to be returned to the container 101.

The container 101 is covered with an heat insulator such as silicon sponge or silicon rubber. Thereby, the heat of IPA vapor 154 of the container 101 is maintained to prevent IPA vapor 154 from being condensed in the container 101.

A level gauge 126 is attached to the side portion of the container 101, and a liquid level of IPA liquid 153 of the container 101 is displayed. The liquid level displayed by the level gauge 126 is measured by a sensor 127, and its measuring signal is input to the controller 93.

A circulation circuit 130 is formed at the lower portion of the container 101. IPA liquid 153 is circulated in the lower portion of the container 101 by the circulation circuit 130.

The circulation circuit 130 has a pump 131 and a filter 132. The container 101 and the trap passage 121 are contained in the casing 100, and a purge $N_2$ gas supply unit 142 communicates with the casing 100 through the circuit 135. Then, N2 gas is purged to the casing 100 from the supply unit 142, and the casing 100 is maintained to be in a non-acid atmosphere.

Figure 8:
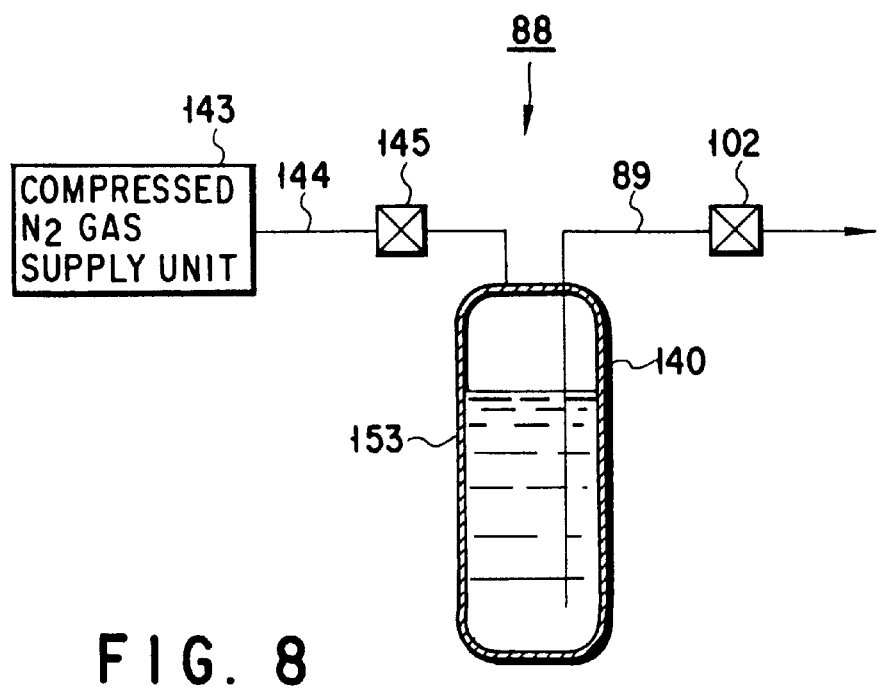
FIG. 8 is a block diagram showing the outline of an IPA liquid unit.

As shown in FIG. 8, the IPA liquid supply unit 88 comprises a canister tank 140 and a compressed $N_2$ gas supply unit 143. The canister tank 140 contains IPA liquid 153, and one end of the circuit 89 is opened to the lower portion of the canister tank 140. The compressed $N_2$ gas supply unit 143 communicates with the upper portion of the canister tank 140 through a circuit 144. The circuit 144 has an open/close valve 145. If compressed $N_2$ gas is introduced to the canister tank 140 from the supply unit 143, IPA liquid 153 is compressed to be sent to the container 101 via the circuit 89 from the tank 140.

The valves 102, 110, 111, 118, 120, 123, and 140 and the heater 105, and the pump 131, which are provided around the IPA vapor generating chamber 86 and the IPA liquid supply unit 88, are controlled by the controller 93 as follows:

First, the controller 93 opens the valve 102 of the circuit 89, and the valve 142 of the circuit 141 to supply compressed $N_2$ gas to the canister tank 140. As a result, IPA liquid 153 is compressed to be sent to the container 101. While IPA liquid 153 is supplied to the IPA vapor generating chamber 86 from the IPA liquid supply unit 88, the controller 93 is not electrically conducted to the heater 105, and IPA liquid 153 is not heated. As a result, no IPA vapor 154 is generated. At this time, since the inner pressure of the container 101 is substantially equal to atmosphere, IPA liquid 153 is smoothly sent to the container 101 by introducing compressed $N_2$ gas to the canister tank 140.

Next, the valve 110 of the circuit 90 and the valve 111 of the circuit 120 are opened to supply compressed $N_2$ gas to the container 101. As a result, IPA liquid 153 is compressed to be sent to the process chamber 19 from the container 101. At this time, IPA liquid 153 of the container 101 may be heated to about 80° C. by the heater 105.

Next, the heating temperature of IPA liquid 153 is set to temperature higher than 80° C. by the heater 105. As a result, IPA liquid 153 of the container 101 is boiled so as to generate a large amount of IPA vapor 154. Under this state, the valve 107 of the circuit 85 is opened, and IPA vapor 154 is supplied to the process chamber 19 from the container 101 by use of the increased inner pressure of the container 101. In this case, while IPA vapor 154 is supplied to the process chamber 19, the valve 102 of the circuit 89 is closed and no IPA liquid 153 is supplied to the container 101. Thereby, IPA liquid 153 of the container 101 is prevented from flowing backward to the canister tank 140 via the circuit 89.

In a case in which the introduction of IPA vapor 154 to the process chamber 19 is temporarily paused or stopped or a case in which the flow rate of IPA vapor 154 to be introduced to the process chamber 19 is restrained, the following process is carried out:

Specifically, the valve 120 of the circuit 117 is opened to allow the part or the whole of IPA vapor 154 of the container 101 to flow to the trap passage 121 to be cooled and condensed. Then, liquidized IPA liquid 153 is returned to the container 101. By setting IPA vapor 154 free to the trap passage 121, the inner pressure of the container 101 can be prevented from being exceeded, and the flow rate of IPA vapor 154 can be controlled.

If IPA liquid 153 of the container 101 is in short supply in accordance with the consumption of IPA liquid 153, the heat setting temperature of the heater 105 is reduced to a value, which is lower than 80° C., and the generation of IPA vapor 154 is stopped. If the inner pressure of the container 101 is equal to atmosphere, the valve 102 of the circuit 89 and the valve 145 of the circuit 144 are opened, so that IPA liquid 153 of the canister tank 140 is compressed to be sent to the container 101 by compressed $N_2$ gas. Thereby, IPA 153 is supplied to the container 101. In order to reduce the inner pressure of the container 101 rapidly, the valve 120 may be opened to allow the part or the whole of IPA vapor 154 of the container 101 to flow to the trap passage 121.

The liquid level displayed by the level gauge 126 is detected by the sensor 127, and the detected liquid level is input to the controller 93, so that the shortage of IPA liquid 153 of the container 101 is detected. In this case, in the controller 93, a threshold value is set in advance. If the liquid level detected by the sensor 127 is less than the threshold value, IPA liquid 153 is compressed to be sent to the container 101 from the canister tank 140. As a result, IPA liquid 153 of the container 101 can be prevented from being lost before it happens. The shortage of IPA liquid of the container 101 can be detected by the temperature sensor 115. In other words, if IPA liquid 153 of the container 101 is in short supply, the temperature of IPA vapor 154 is gradually increased. In this case, the temperature of IPA vapor 154 is detected by the sensor 115. Then, when the detected temperature is more than a predetermined threshold value, IPA liquid 153 may be compressed to be sent to the container 101 from the canister tank 140.

If IPA liquid 153 is heated for a long period of time to be vaporized, impurity material contained in IPA liquid is gradually condensed so as to be accumulated in the container 101. The controller 93 periodically drives the pump 131 to circulate IPA liquid 153 of the container 101 into the circuit 130, and to filter impurity material by the filter 132 to be removed.

In the case of exchanging the canister tank 140 or maintaining the canister tank 140, the valve 118 of the circuit 116 is opened to set the interior of the container 101 to be atmosphere. The circuit 89 cannot be opened to atmosphere until the interior of the container 101 is set to be atmosphere. Thereby, the interior of the container 101 is not opened in a high temperature and high pressure state, and IPA vapor 154 of high temperature can be prevented from flowing backward. Also, IPA vapor 154 can be prevented from being jetted to the supply unit 88.

Next, the following will explain the operation of washing/drying wafers W.

First, the cassette C, which contains 25 unwashed wafers W are conveyed to the loader section 2 to be mounted on the cassette station 5. The cassette C is transferred onto the stage 6 from the station 5 by the transfer device 7. On the stage 6, 50 wafers W are taken out of two cassettes C at one time, and the orientation flats of the wafers W are arranged to be the same as each other.

The 50 wafers W are held at one time by the wafer chuck 36 of the transfer device 30, so that these wafers W are transferred to the process chambers 12, 13, and 14. In the process chamber 13, there is carried out the so-called SC1 cleaning in which the wafers W are washed with mixing chemicals ($NH_4OH+H_2O_2+H_2O$) of ammonia water solution and hydrogen peroxide solution. In the process chambers 13 and 14, the wafers W are rinsed with pure water.

After the SC1 cleaning and the rinse cleaning are ended, 50 wafers W are taken out of the process chamber 14 at one time by the wafer chuck 37 of the transfer device 31. Moreover, these 50 wafers W are transferred to the process chambers 15, 16, and 17, sequentially.

In the process chamber 15, there is carried out the so-called SC2 cleaning in which the wafers W are washed with mixing chemicals ($HCl+H_2O_2$) of hydrochloric acid solution and hydrogen peroxide solution. In the SC2 cleaning, the metallic ion is removed from the wafer surface, so that the wafer surface is stabilized. In the process chambers 16 and 17, the wafers W are rinsed with pure water.

After the SC2 cleaning and the rinse cleaning are ended, 50 wafers W are taken out of the process chamber 17 at one time by the wafer chuck 38 of the transfer device 32. Moreover, these 50 wafers W are transferred to the next process chamber 19 at one time.

Figure 9:
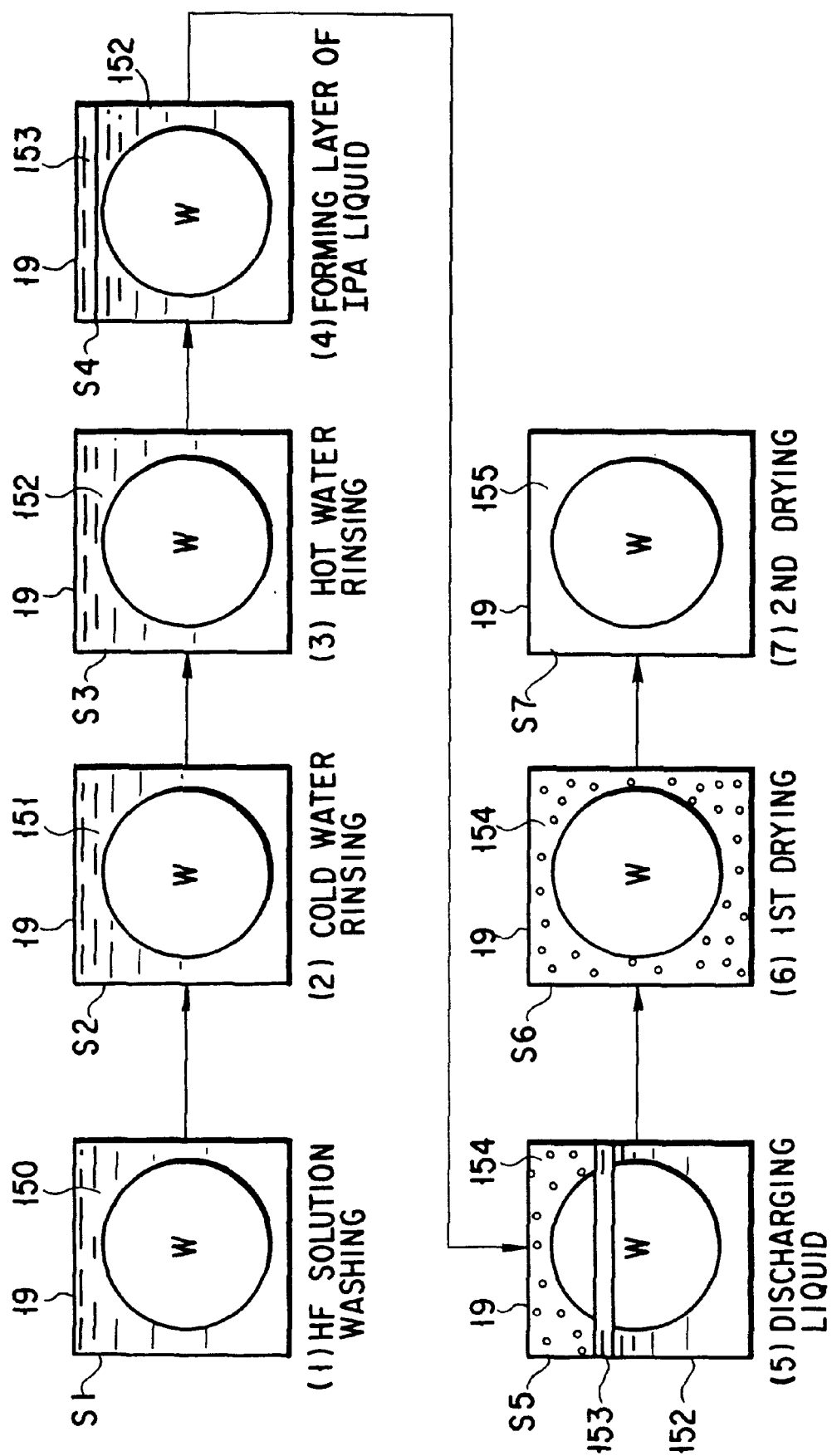
FIG. 9 is a flow chart of the wafer washing/drying process.

Next, the following will explain the case in which the wafers W are washed and cleaned in the process chamber 19 with reference to the flow chart of FIG. 9.

In the process chamber 19, dilute hydrofluric acid solution 150 having a predetermined concentration. HF solution 150 is circulated between the process chamber 19 and the washing liquid circulation mechanism 75 through the circuits 61 and 63. In the process chamber 19, the upward flow of HF solution 150 is formed. At the upper portion of the process chamber 19, the wafer chuck 38 in which the wafers W are held is in a standby state.

The cover 71 is opened and the wafer chuck 38 is moved down, and 50 wafers W are mounted on the board 50 of the process chamber 19 at one time. The wafer chuck 38 is retreated upward, and the cover 71 is closed. Then, as shown in step S1 of FIG. 9, the wafers W are completely dipped in HF solution, so that the wafers W are cleaned with the circulated upward flow of HF solution. This HF cleaning-process operation is controlled by the controller 93 in accordance with a predetermined recipe (setting concentration/setting time).

After ending the HF cleaning process, the circulation of HF solution 150 and the supply is stopped, and pure water (cold water) of about room temperature is supplied to the process chamber 19 from the supply unit 77. HF solution 150 is overflowed from the process chamber 19 by supplied cold water 151, and the overflowed liquid is exhausted to the drain section 79 through the circuit 80.

As shown in step S2 of FIG. 9, cold water 151 is continuously supplied from the supply unit 77 for some time. Then, wafers W are rinsed with cold water 151 as HF solution 150 of the process chamber 19 is substituted with cold water 151. Then, resistivity of liquid of the process chamber 19 is detected. When the detected value is below a defined value, the supply of cold water is stopped.

Next, pure water (hot water) 152 whose temperature is controlled to be more than the room temperature and less than 80° C. is supplied to the process chamber 19 from the supply unit 78. Then, cold water 151 is overflowed from the process chamber 19 by hot water 152, and the overflowed liquid is exhausted to the drain section 79 through the circuit 80.

As shown in step S3 of FIG. 9, hot water 152 is continuously supplied from the supply unit 78 for some time. Then, wafers W are rinsed with hot water 152 as cold water 151 of the process chamber 19 is substituted with hot water 152. Thereby, the temperature of the wafers W is controlled to be more than the room temperature and less than 80° C. The hot water rinse step S3 is time-controlled. Due to this, if a predetermined period of time is passed from the hot water supplying time, the supply of hot water 152 is stopped. The cleaning liquid circulation mechanism 75 has a pump, a dumper, a filter, a plurality of lines for supplying liquid, and lines for exhausting liquid (which are not shown) within.

Next, IPA liquid 153 heated at about 80° C. in the IPA vapor generating chamber 86 is taken out of the container 101 through the circuit 90 to be introduced to the process chamber 19. This introduction of IPA liquid 153 to the process chamber 19 is controlled by the controller 93. More specifically, two valves 110 and 111 are opened to supply compressed $N_2$ gas to the container 101, and IPA liquid 153 is compressed to be sent to the process chamber 19 from the container 101 through the circuit 90. Thus, as shown in step S4 of FIG. 9, the liquid level of hot water 152 is completely covered with the layer of IPA liquid 153. The IPA liquid 153 forming the surface layer has substantially the same temperature as the hot water 152.

The layer of IPA liquid 153 may be formed by introducing IPA vapor 154 to the process chamber 19 from the IPA vapor generating chamber 86 through the circuit 85. The layer of IPA liquid 153 can be easily formed when the temperature of hot water 152 is lower than that of IPA vapor 154. If IPA vapor 154 is generated, the inner pressure of the container 101 is higher than the inner pressure (atmosphere) of the process chamber 19. Due to this, by use of the pressure difference therebetween, IPA vapor 154 can be introduced to the process chamber 19.

After, thus, forming the layer of IPA liquid 153, IPA vapor 154 is started to be introduced to the process chamber 19 from the IPA vapor generating chamber 86. Or, in a case where the layer of IPA liquid 153 is formed by introducing IPA vapor 154 to the process chamber 19, IPA vapor 154 is continued to be introduced to the process chamber 19. In the case of introducing IPA vapor 154 to the process chamber 19, IPA liquid 153 is heated to about 120° C. (temperature which is more than boiling point of IPA) by the heater 105, so as to boil IPA liquid 153 in the container 101. Since the circuit 85 is maintained at about 80° C. by the tape heater 87, IPA vapor 154 can be introduced to the process chamber 19 without being condensed in the circuit 85. As shown in step S5 of FIG. 9, hot water 152 of the process chamber 19 is gradually discharged to the drain section 79 as maintaining the introduction of IPA vapor 154 to the process chamber 19. Since hot water 152 is covered with the layer of IPA liquid 153 until the discharging step S5 is ended, water vapor is not mixed with IPA vapor 154, purity of IPA vapor 154 of the process chamber 19 can be highly maintained. Then, hot water 152 is discharged from the process chamber 19 and IPA liquid 153 is further exhausted.

As shown in step S6 of FIG. 9, even after liquid of the process chamber 19 is completely exhausted, IPA vapor 154 is continuously introduced to the process chamber 19, so that the interior of the process chamber 19 can be further dried. If a predetermined period of time lapses since the start of discharging liquid, the controller 93 stops the introduction of IPA vapor 154 to the process chamber 19. The wafers W are dried by IPA vapor 154 of the process chamber 19 (first drying step S6).

If the first drying step S6 is ended, the heating of IPA liquid 153 due to the heater 105 in the IPA vapor generating chamber 86 is stopped. Next, the valve 111 of the circuit 112 is opened, and compressed $N_2$ gas is supplied to the casing 100. $N_2$ gas is introduced to the process chamber 19 through the circuit 85 to drive IPA vapor 154 out of the process chamber 19. As shown in step S7 of FIG. 9, the interior of the process chamber 19 is set to non-acid dry atmosphere with substituted $N_2$ gas 155, thereby drying the waters W (second drying step). An object of the second drying step S7 is to completely remove adhered IPA from the wafer surface so as to completely dry the wafers W without generating "water mark" on each wafer surface. In this case, substituted $N_2$ gas 155 is preferably heated to about 80° C.

As shown in FIG. 6, the $N_2$ gas can be introduced into a $N_2$ gas supply unit 82 via a circuit 81.

When the second drying step S7 is ended, the cover 71 is opened, and the wafers W are taken out of the process chamber 19 by the wafer chuck 38 of the transfer device 32 at one time. In this case, the wafer conveying device for conveying the wafers W from the process chamber 19 and the wafer conveying device for conveying the wafers W to the process chamber 19 may be separately used. The processed wafers W are conveyed to the unloader section 4 to be contained in the cassette C, and further conveyed therefrom together with the cassette C by a robot (not shown).

According to the present invention, since organic solvent is supplied in only a state that the pressure of the vapor generating chamber is low, organic solvent can be smoothly supplied from the organic solvent supply unit. Also, it is possible to prevent organic solvent vapor of the vapor generating chamber from flowing backward to the solvent supply unit side, the organic solvent can be safely supplied without causing a fire hazard.

Moreover, according to the present invention, organic solvent can be compressed to be sent to the vapor generating chamber from the solvent supply unit by compressed gas. Also, by use of the pressure difference between the inner pressure of the vapor generating chamber and that of the process tank, solvent vapor can be supplied to the process tank from the vapor generating chamber. Moreover, impurity material contained in the organic solvent can be effectively prevented from being condensed and staying in the vapor generating chamber. Moreover, solvent vapor generated in the vapor generating chamber can be efficiently supplied to the process tank without being condensed. Moreover, in introducing solvent vapor to the process chamber, solvent vapor can be uniformly supplied to the entire surface of the substrate.

The shortage of organic solvent of the vapor generating chamber can be detected by detecting the level of liquid organic solvent of the vapor generating chamber or detecting the temperature of solvent vapor of the vapor generating chamber. As a result, sufficient organic solvent can be always contained in the vapor generating chamber. Moreover, since the atmosphere around the vapor generating chamber and the process chamber can be set to be non-acid gas atmosphere, a fire hazard can be prevented.

Next, the following will explain a second embodiment of the present invention with reference to FIGS. 10 to 16.

Figure 10:
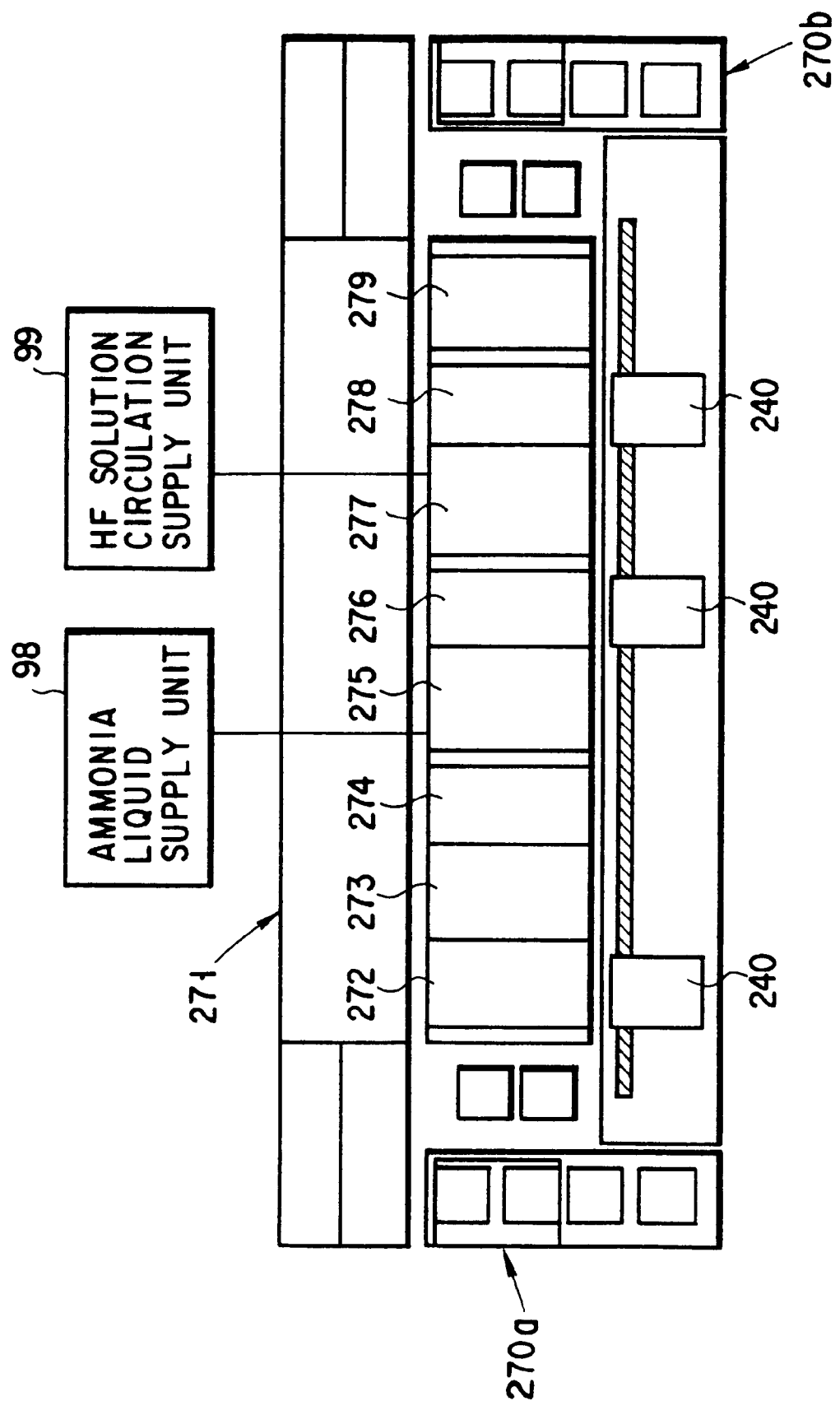
FIG. 10 is a schematic plane view of the wafer washing/drying device.
Figure 11:
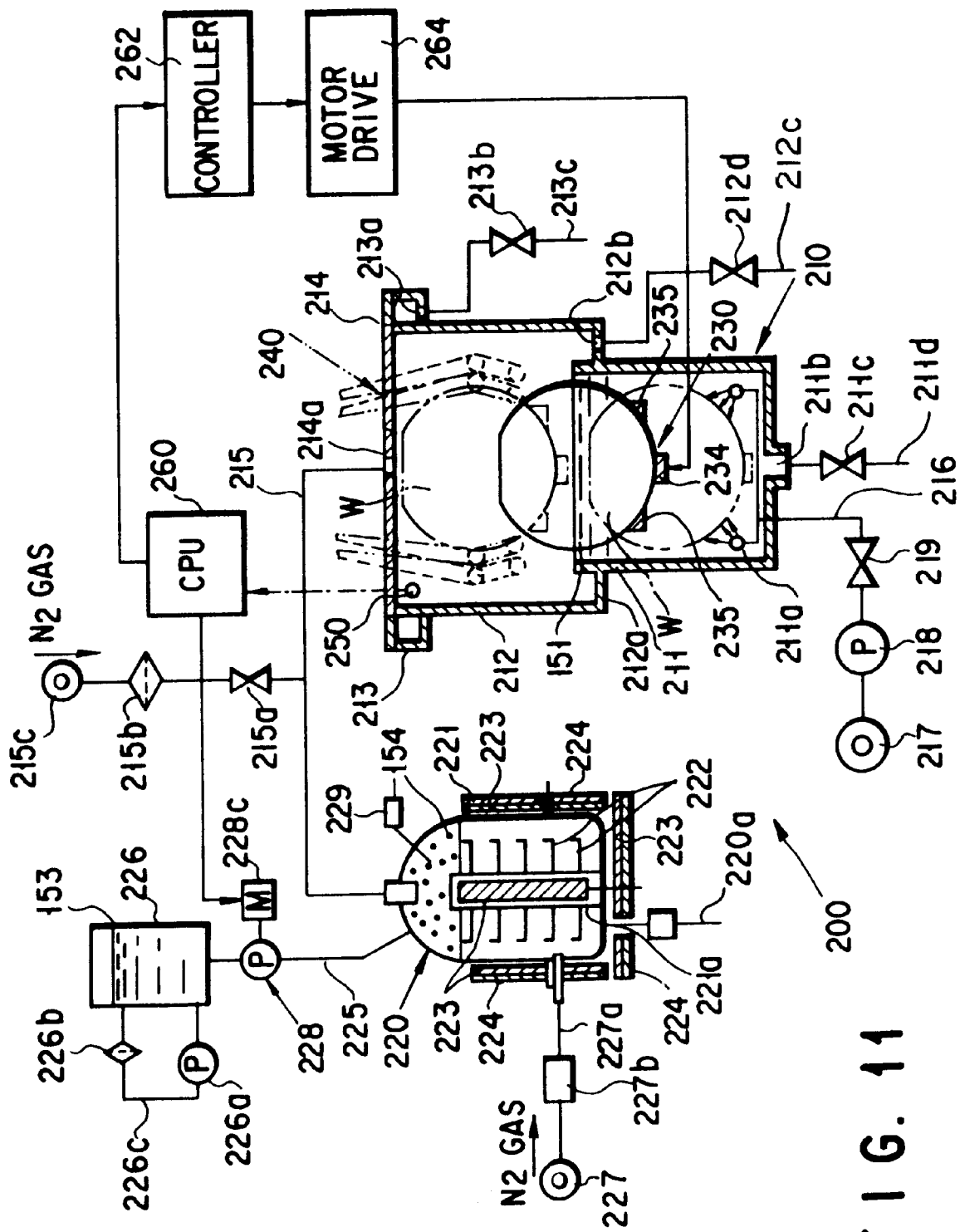
FIG. 11 is a block diagram showing a washing/drying device for a substrate according to an embodiment of the present invention.

The device of the present invention can be singly used and incorporated into a substrate washing/drying process system shown in FIG. 10. The substrate washing/drying process system comprises a sending-in section 270a, a process section 271, a sending-out section 270b, and three wafer chucks 240. The sending-in section 270a receives unprocessed substrates. The process section 271 has a plurality of process units for washing and drying the substrates. The sending-out section 270b sends out processed substrates.

The process section 271 comprises a first chuck washing/drying unit 272, a first chemical washing unit 273, a first water washing unit 274, a second chemical washing unit 275, a second water washing unit 276, a third chemical washing unit 277, a second chuck washing/drying unit 278, and a final water washing/drying unit 279. In the second chemical washing unit 275, the substrates are washed with mixing chemicals of ammonia water solution and hydrogen peroxide solution. In the third chemical washing unit 277, the substrates are washed with dilute hydrofluoric acid solution (HF solution). Since ammonia components contained in the second chemicals are consumed during the circulation and supply, ammonia solution is supplied to the circulation circuit of the unit 275 from the supply unit 98. Also, since hydrofluoric acid components contained in the third chemicals are consumed during the circulation and supply, hydrofluoric acid solution is supplied to the circulation circuit of the unit 277 from a supply unit 99.

A substrate washing/drying device 200 comprises a washing/drying process section 210, a solvent/vapor generator 220, a solvent tank 226, and an $N_2$ gas supply unit 227. The process section 210 has a washing vessel 211 for washing wafers W, and a drying process chamber 212 for drying wafers W. The drying process chamber 212 is positioned just above the washing vessel 211. The solvent/vapor generator 220 communicates with the process chamber 212 through a passage 215 for supplying IPA vapor. The solvent tank 226 communicates with the solvent/vapor generator 220 through a passage 225 for supplying IPA liquid. The $N_2$ gas supply unit 227 communicates with the solvent/vapor generator 220 through a passage 227a for supplying $N_2$ gas. The tube 225 has a flow rate controller 228 for controlling the flowrate of IPA liquid 153. The tube 227a has a flowrate controller for controlling the flowrate of $N_2$ gas.

A lower portion overflow vessel 212a is formed to surround the opening of the upper portion of the washing vessel 211. Then, washing liquid overflowed from the washing vessel 211 flows to the overflow vessel 213. The opening of the upper portion of the process chamber 212 including the overflow vessel 213 is covered with an opening/closing cover 214.

A discharge liquid port 212b is formed at the bottom portion of the overflow vessel 212a, and a drain passage 212c is connected to the discharge liquid port 212a. The drain passage 212c communicates with a drain case (not shown) through an opening/closing valve 212d. Similarly, a discharge liquid port 213a is formed at the bottom portion of the overflow vessel 213, and a drain passage 213c is connected to the discharge liquid port 213a. The drain passage 212c communicates with a drain section (not shown) through a valve 213b.

A plurality of nozzles 211a are formed at the inner bottom portion of the washing vessel 211. Each of the nozzles 211a communicates with a pure water supply unit 217 through a passage 216. A pump 218 and an opening/closing valve 219 are attached to the passage 216 for supplying pure water. A discharge liquid port 211b is formed at the center of the bottom portion of the washing vessel 211, and a discharge liquid passage 211d is connected to the discharge liquid port 211b through an opening/closing valve 211c. As shown in FIG. 12, notches 211e, 211e are formed at an opening end portion of the washing tank 211 and an opening end portion of the upper end of the process chamber 212 to have a predetermined pitch, respectively. Washing liquid flows to each of the overflow vessels 212a and 213 via these notches 211e, 211e.

A wafer board 230 is formed in the process chamber 212. The wafer board 230 comprises a pair of support members 233, a central holding rod 234, and two side portion holding rods 235. The support members 233 are inversely T-shaped, and the central holding rod 234 and two holding rods 235 are horizontally supported at the lower end portion. The upper end portion of the support member 233 is fastened to the member 232 by a bolt 232a, and the member 232 is movably connected to a lift mechanism 231.

These holding rods 234 and 235 are formed to extend from one support member 233 to the other support member 233 (not shown). The holding rod 234 is positioned at substantially the central portion between two holding rods 235. Each of these holding rods 234 and 235 has 50 grooves 234a and 235a with a regular pitch distance. These holding rods 234 and 235 are formed of engineering plastic such as polyether ether ketone (PEEK) having corrosion-resistance, heat-resistance, and strength-resistance, or quatz.

The upper cover 214 has a solvent/vapor support port 214a, and the solvent/vapor generator 220 communicates with the solvent/vapor support port 214a through the passage 215. As shown in FIG. 13, the solvent/vapor generator 220 comprises a closed case 221 of quartz. The closed case 221 has five stacking evaporation pans 222 for IPA and a heater 223. IPA liquid 153 is supplied to these pans 222 from an IPA tank 226. Each of pans 222 is made of stainless steel having a good thermal conductivity and corrosition-resistance, or quartz. The heater 223 is formed in the vicinity of the evaporation pans 222, and IPA liquid 153 received by the pans 222 is heated by the heater 223.

As shown in FIG. 13, these evaporation pans 222 are supported by a cylindrical support 221a in a multistage manner to have a regular pitch distance. The evaporation pan 222, which is provided at the upper stage, has a downstream port 222a, and IPA liquid 153 flows down to the pan 222, which is provided at the lower stage through the downsteam port 222a. The downsteam port 222a of the lower stage is positioned to be shifted from the downstream port 222a of the upper stage. The flow of IPA liquid 153 is zigzagged to the downsteam port 222a of the lower stage from the downsteam port 222a of the upper stage. The heater 223 is provided at each of the bottom portion of the closed case 221, the side wall portion, and the hollow portion of the support 221a. A heat insulator 224 is provided at the back portion of each heater 223.

IPA liquid 153 is heated by the heater 223 during the process in which IPA liquid 153 flows from the evaporation pan 222 of the uppermost stage to the pans 222 of the lower stages, sequentially. As a result, IPA vapor 154 is generated. A large amount of IPA vapor 154 is generated while IPA liquid 153 is passed through the five stacking pans 222. Thus, since the solvent/vapor generator 220 has stacking pans 222, the solvent/vapor generator 220 can be minaturized, so that generation efficient of IPA vapor 154 can be largely increased.

IPA vapor 154 generated by the solvent/vapor generator 220 is supplied to the process chamber 212 with $N_2$ gas supplied from $N_2$ gas supply unit 227. In this case, a heater 227b is attached to the passage 227a, which communicates with the $N_2$ gas supply unit 227 and the closed case 221. $N_2$ gas is heated to a predetermined temperature by the heater 227b.

The IPA tank 226 is formed of fluoride resin having good chemical-resistance. The IPA tank 226 has a special circulation passage 226c. The circulation passage 226c has a pump 226a, and a filter 226b, and impurity material contained in IPA liquid 153 can be removed by the filter 226b.

The flowrate controller 228 comprises a quantitative electric motor drive bellows pump having a bellows 228a and a ball screw mechanism 228b. The bellows 228a is reciprocated by the drive of the ball screw mechanism 228b due to a pulse motor 228c. Thereby, IPA liquid 153 is supplied to the solvent/vapor generator 220 at the rate of 0.01 to 5 cc/sec.

A power switch of the pulse motor 228c is connected to an output section of a CPU 260. A concentration sensor 250 is provided to detect concentration of solvent/vapor 154 of the process chamber 212. The concentration sensor 250 is connected to an input portion of the CPU 260.

If the CPU 260 receives a vapor concentration detection signal from the sensor 250, the CPU 260 controls the operation of the pulse motor 228c. As a result, the flowrate of IPA liquid 153, which is supplied from the tank 226 to the solvent/vapor generator 220, is controlled.

The output section of CPU 260 is connected to a controller 262, and an output section of a controller 262 is connected to a motor drive 264. Moreover, an output side of the motor drive 264 is connected to a power switch of the board lift mechanism 231.

A supply unit 215c for purging $N_2$ gas of the process chamber 212 is connected to the solvent/vapor supply passage 215 through an opening/closing valve 215a and a filter 215b. Also, the closed case 221 of the solvent/vapor generator 220 has a temperature indicator 229 to observe the temperature of the generator 220. A drain passage 220a is connected to the bottom portion of the closed case 221 of the generator 220 to discharge waste liquid staying in the closed case 221 through the drain passage 220a.

Next, the following will explain steps S21 to S30 in which wafers W are washed and dried by the washing/drying device 200 with reference to the flow chart of FIG. 14. In FIG. 14, a wafer chuck 240, the wafer board 230, and the nozzle 211a are omitted for simplification.

In step S21 of FIG. 14, first, pure water 151 is supplied to the process section 210 to overflow pure water 151 to the overflow tank 213 from the process chamber 221. In this case, the wafer board 230 is set in a standby state at the process chamber 212.

Next, in step S22, the wafers W are conveyed to the process section 210 by the wafer chuck 240 to be mounted on the board 230 from the chuck 240. Then, the wafer chuck 240 is reteated upward, and the cover 214 is closed.

In step S23, the wafers W are moved down to the washing vessel 211 together with the board 230. At this time, pure water 151 of the process chamber 212 is discharged to prevent the wafers W from being exposed to the liquid level. $N_2$ gas is supplied to an upper space of pure water 151 from the gas supply unit 215. Thereby, particles adhered to the inner wall of the process chamber 212 is discharged together with pure water 151. Also, particles, which float on the liquid surface of pure water 151 overflowing from the washing vessel 211, are discharged. As a result, as shown in step S24, the interior of the process chamber 212 is substituted with $N_2$ gas.

In step S25, IPA vapor 154 and $N_2$ gas are supplied to the process chamber 212. After the interior of the process chamber 212 is set to be IPA vapor atmosphere, the wafer board 230 is raised to move the wafers W to the IPA vapor atomosphere as shown in step S27. As a result, the wafers W are brought into contact with IPA vapor 154.

As shown in step S27, by the so-called Marangoni effect in which the wafers W are brought into contact with IPA vapor 154, liquid adhered onto each wafer surface is removed, and each wafer surface is dried.

Figure 15:
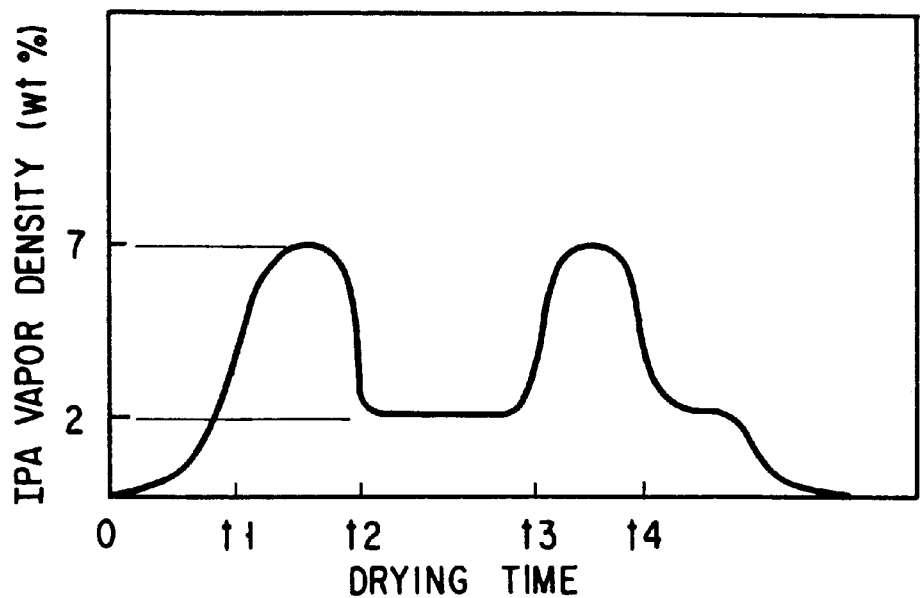
FIG. 15 is a characteristic line view showing the relationship between drying time and concentration of IPA vapor.

FIG. 15 is a characteristic line view showing concentration change of supplied IPA vapor in drying step S27 wherein a horizontal axis shows drying time and a vertical axis shows concentration of IPA vapor (wt %). As shown in FIG. 15, at a drying initial period (time $t_1$ to $t_2$), the supplying operation of IPA vapor 154 is controlled such that concentration of IPA vapor is set to about 7 wt %. Next, at a drying middle period (time $t_2$ to $t_3$), concentration of IPA vapor is reduced to about 2 wt %. Then, at a drying final period (time $t_3$ to $t_4$), concentration of IPA vapor is increased to about 7 wt % again. As a result, at the initial period, solvent/vapor atmosphere can be formed for a short period of time. At the final period, the members other than the wafers W such as the board 230, the inner wall of the washing vessel 211, and the bottom wall can be speedily dried, the process with high through-put can be realized. Moreover, at the middle period, the amount of consumption of IPA liquid 154 can be largely reduced.

The supplying operation of IPA vapor 154 to the process chamber 212 is time-controlled by CPU 260. In the vapor supplying operation after the drying middle period, a feedback control may be used in place of time-control. Specifically, concentration of IPA vapor 154 of the process chamber 212 is detected by the sensor 250. Then, the CPU 260 may feedback-control the supplying operation of IPA vapor 154 to the process chamber 212 based on the detected concentration of vapor.

Figure 16:
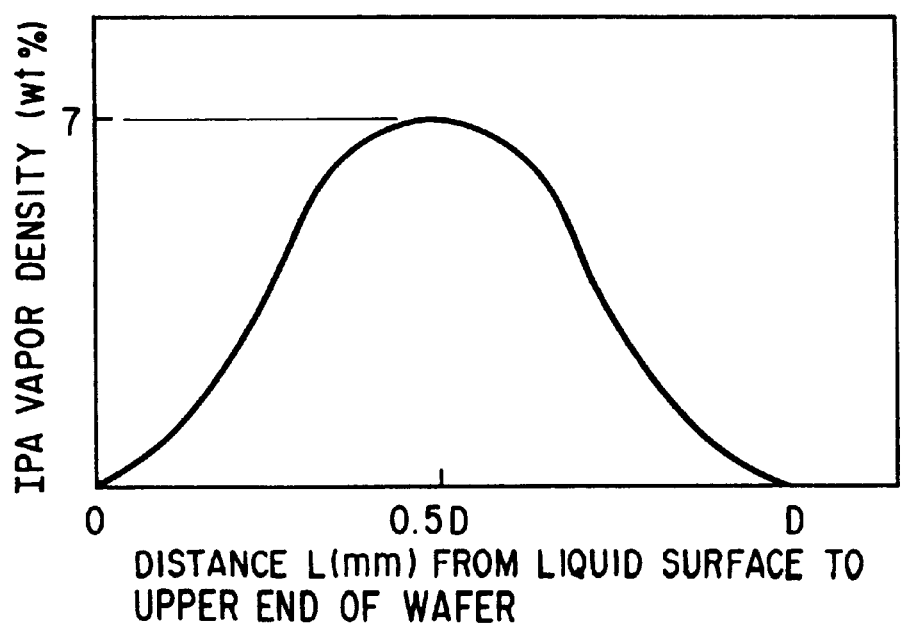
FIG. 16 is a characteristic line view showing the relationship between a distance, which is from a liquid level to an upper end of the wafer, and concentration of IPA vapor.

FIG. 16 is a characteristic line view showing the relationship between a distance L (mm) and concentration of IPA vapor (wt %) wherein the distance L, which is from the liquid level to the upper end of wafer W, is shown by a horizontal axis and concentration of IPA vapor to be supplied to the process chamber is shown by a vertical axis. In drying steps S26 to 27, the CPU 260 counts the number of rotations of a servo motor (not shown) provided in the board lift mechanism 231. The CPU 260 obtains an amount of rising the board 230 based on the counted number of rotations, and obtains the distance L (mm) from the liquid level to the upper end of the wafer. The distance L (mm) corresponds to an exposed area A of wafers W exposed at the portion, which is higher than the liquid level. In this embodiment, concentration of IPA vapor 154 to be supplied to the process chamber 212 is changed in accordance with distance L (mm). More specifically, if the distance L (mm) is smaller than the radius (0.5 D) of each wafer W, concentration of supplying IPA vapor 154 is increased. If the distance L (mm) is larger than the radius (0.5 D) of each wafer W, concentration of supplying IPA vapor 154 is increased. Then, if the distance L (mm) is just equal to the radius (0.5 D) of each wafer W, concentration of supplying IPA vapor 154 is set to be maximum. In this case, the maximum concentration of supplying IPA vapor 154 is set to about 7 wt %.

Thus, concentration of the supplying IPA vapor 154 is controlled in accordance with the change of the increase of the wafer exposing area A. As a result, IPA vapor 154 can be effectively used, and the amount of consumption of IPA liquid 153 can be largely increased.

After the wafer drying process is ended, pure water 154 of the lower washing tank 211 is discharged as shown in step S28 of FIG. 14. In step S29, pure water 151 is completely discharged from the washing vessel 211. After a predetermined lapse of time, dry $N_2$ gas is introduced to the process section 210. As a result, IPA vapor 154 is driven out of the process section 210, and the interior of the process section 210 is substituted with dry $N_2$ gas. As shown in step S30, the upper cover 214 is opened, and wafers W are conveyed from the process section 210 by the wafer chuck 240.

The above embodiment explained the case in which the semiconductor wafers were washed and dried. However, the present invention is not limited to the above case. For example, the present invention may be used in a case in which a glass substrate for LCD is washed and dried.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

We claim:

1. A substrate drying apparatus comprising:

a process chamber;

transferring means for transferring a substrate to/from said process chamber;

a solvent vapor generating chamber having a container for receiving liquid organic solvent and a heater for heating said liquid organic solvent of said container to generate vapor of the organic solvent;

a solvent supply unit for supplying the liquid organic solvent of said container;

a first passage, communicating with said solvent vapor generating chamber and said process chamber, for passing vapor of the organic solvent;

a second passage, communicating with the container of said solvent vapor generating chamber and said solvent supply unit, for passing liquid organic solvent;

a flow rate controller for controlling flow rate of the liquid organic solvent to be supplied to said solvent vapor generating chamber from said solvent supply unit; and control means for detecting at least one of a liquid level and temperature of organic solvent of at least one of said solvent vapor generating chamber and said process chamber, and for controlling an operation of said flow rate controller based on said detected at least one of said liquid level and temperature of organic solvent.

2. The apparatus according to claim 1, further comprising a lower portion washing vessel, formed at a lower portion of said process chamber to communicate with said process chamber, and having washing liquid supplied to wash the substrate, and an overflow vessel having washing liquid overflowed from said lower portion washing vessel.

3. The apparatus according to claim 1, further comprising a concentration sensor for detecting a concentration of organic solvent vapor of said process chamber, and said control means controls said flow rate controller based on the detected concentration of said concentration sensor.

4. The apparatus according to claim 1, further comprising stacking evaporation pans, formed in the container of said solvent vapor generating chamber, each having a downstream port for introducing liquid organic solvent down to a lower stage from an upper stage, sequentially.

5. The apparatus according to claim 4, wherein said heater is provided at each of a bottom portion of said container, a side wall portion, and a support portion of each of said evaporation pans.

6. The apparatus according to claim 1, further comprising non-oxidizing gas supplying means for supplying non-oxidizing gas to said solvent vapor generating chamber, and said non-oxidizing gas supplying means supplying non-oxidizing gas to the solvent vapor generating chamber such that vapor of organic solvent is sent to said process chamber through said first passage together with non-oxidizing gas.

7. The apparatus according to claim 1, further comprising compressed gas supplying means for supplying compressed non-oxidizing gas to said solvent supply unit, and said compressed gas supplying means supplying compressed gas to a solvent supply unit such that liquid organic solvent is sent to said solvent vapor generating chamber from said solvent supply unit through said second passage.

8. The apparatus according to claim 1, further comprising a circulation circuit for circulating liquid organic solvent of a solvent supply unit, and said circulation circuit having a filter for filtering impurity material of liquid organic solvent circulating in the circulation circuit to remove said impurity material.

9. The apparatus according to claim 1, further comprising a second heater, provided at said first passage, for heating vapor of organic solvent circuiting in said first passage to prevent vapor of organic solvent from being condensed in said first passage.

10. The apparatus according to claim 1, further comprising a lower portion washing vessel, formed at a lower portion of said process chamber to communicate with said process chamber, and having washing liquid supplied to wash the substrate, and an overflow vessel having washing liquid overflowed from said lower portion washing vessel, said first passage being opened to a side wall surface of said overflow vessel to introduce vapor of organic solvent to a portion close to a liquid level of washing liquid of said lower portion washing vessel through the opening of said first passage.

11. The apparatus according to claim 1, further comprising liquid level detecting means for detecting a liquid level of organic solvent of said solvent vapor generating chamber, and said control means operates said flow rate controller to supply liquid organic solvent to said solvent vapor generating chamber from a solvent supply unit when the liquid level detected by said liquid level detecting means is less than a threshold value.

12. The apparatus according to claim 1, further comprising temperature detecting means for detecting temperature of vapor of organic solvent of said solvent vapor generating chamber, and said control means operates said flow rate controller to supply liquid organic solvent to said solvent vapor generating chamber from said solvent supply unit when the temperature detected by said temperature detecting means is more than a threshold value.

13. The apparatus according to claim 1, wherein:

said control means detects said liquid level and said temperature of said organic solvent and controls said operation of said flow controller based on said detected liquid level and said temperature of said organic solvent.

14. A substrate drying method of heating liquid organic solvent supplied to a solvent vapor generating chamber from an organic solvent supply unit to generate vapor of organic solvent, and introducing the organic solvent vapor to a process chamber to dry a substrate of the process chamber, comprising the steps of, supplying no liquid organic solvent to said solvent vapor generating chamber from the organic solvent supply unit while vapor of organic solvent is introduced to the process chamber from said solvent vapor generating chamber, restraining generation of organic solvent vapor of said solvent vapor generating chamber while liquid organic solvent is supplied to said solvent vapor generating chamber from said organic solvent supply unit.

15. The method according to claim 14, wherein compressed non-oxidizing gas is supplied to said organic solvent supply unit, thereby liquid organic solvent is sent to the solvent vapor generating chamber from said organic solvent supply unit.

16. The method according to claim 14, wherein vapor of organic solvent is generated in said solvent vapor generating chamber such that inner pressure of the solvent vapor generating chamber becomes higher than that of the process chamber, and vapor of organic solvent is introduced to the process chamber by use of a differential pressure between said solvent vapor generating chamber and said process chamber.

17. The method according to claim 14, wherein liquid organic solvent of said solvent vapor generating chamber is circulated to be filtered such that impurity material of liquid organic solvent.

18. The method according to claim 14, wherein vapor of organic solvent is heated to be prevented from being condensed while vapor of organic solvent is supplied to said process chamber from said solvent vapor generating chamber.

19. The method according to claim 14, wherein an interior of the solvent vapor generating chamber is set to atmospheric pressure before a passage for supplying liquid organic solvent is communicated to ambient atmosphere, thereafter, liquid organic solvent is supplied to said solvent vapor generating chamber from said organic solvent supply unit.

20. The method according to claim 14, wherein when a liquid level of organic solvent of said solvent vapor generating chamber is detected and the detected liquid level is less than a threshold value, liquid organic solvent is supplied to the solvent vapor generating chamber from the solvent supply unit.

21. The method according to claim 14, wherein when temperature of organic solvent of said solvent vapor generating chamber is detected and the detected temperature is more than a threshold value, liquid organic solvent is supplied to the solvent vapor generating chamber from the solvent supply unit.

22. The method according to claim 14, wherein an ambient atmosphere of said solvent vapor generating chamber comprises a non-oxidizing gas.

23. The method according to claim 14, wherein an ambient atmosphere of said process chamber comprises a non-oxidizing gas.

24. A substrate drying method of heating liquid organic solvent supplied to a solvent vapor generating chamber from an organic solvent supply unit to generate vapor of organic solvent, introducing the organic solvent vapor to a process chamber to dry a substrate of the process chamber, and comprising the steps of:

detecting a processing state of the substrate; and controlling an amount of supply of liquid organic solvent to said solvent vapor generating chamber in accordance with said detected processing state of the substrate so as to change concentration of organic solvent vapor to be supplied to said process chamber from said solvent vapor generating chamber.

25. The method according to claim 24, further comprising the steps of supplying dry gas with higher concentration at an initial drying initial period, supplying dry gas with concentration lower than the initial drying period, and supplying dry gas with higher concentration at a final drying period.

26. A substrate drying method of moving a substrate and a washing vessel with respect to each other after dipping the substrate in washing liquid to be cleaned, bringing vapor of organic solvent generated in a solvent vapor generating chamber into contact with the substrate to be dried, and comprising the steps of:

detecting a surface area of the substrate exposed to an upper portion of a liquid level of washing liquid during the movement of said substrate and washing vessel; and controlling an amount of supply of liquid solvent to said solvent vapor generating chamber based on the detected surface area of the substrate to change concentration of vapor of organic solvent to be brought into contact with the substrate exposed to the upper portion of the liquid level.

27. The method according to claim 26, further comprising the steps of;

detecting a surface area of a boat for holding the substrate exposed to the upper portion of the liquid level of washing liquid; and controlling an amount of supply of liquid solvent to said solvent vapor generating chamber based on the detected surface area of the boat and the detected surface area of the substrate.

\* \* \* \* \*